United States Patent
Shu et al.

(10) Patent No.: US 12,148,376 B2
(45) Date of Patent: Nov. 19, 2024

(54) DISPLAY SUBSTRATE, MANUFACTURING METHOD THEREOF, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaoqing Shu, Beijing (CN); Bo Zhang, Beijing (CN); Rong Wang, Beijing (CN); Hongwei Ma, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/916,101

(22) PCT Filed: May 31, 2021

(86) PCT No.: PCT/CN2021/097532
§ 371 (c)(1),
(2) Date: Sep. 30, 2022

(87) PCT Pub. No.: WO2022/252094
PCT Pub. Date: Dec. 8, 2022

(65) Prior Publication Data
US 2023/0306903 A1    Sep. 28, 2023

(51) Int. Cl.
*G09G 3/3233* (2016.01)
*H01L 27/02* (2006.01)
(Continued)

(52) U.S. Cl.
CPC ....... *G09G 3/3233* (2013.01); *H01L 27/0248* (2013.01); *H10K 59/1213* (2023.02);
(Continued)

(58) Field of Classification Search
CPC ......... G09G 3/3233; G09G 2310/0286; G09G 2330/06; G09G 2300/0426;
(Continued)

(56) References Cited

U.S. PATENT DOCUMENTS 9,547,036 B2   1/2017  Kang et al.
10,268,296 B2  4/2019  Choi et al.
(Continued)

FOREIGN PATENT DOCUMENTS

CN    1703126 A    11/2005
CN   101853925 A   10/2010
(Continued)

*Primary Examiner* — Amare Mengistu
*Assistant Examiner* — Gloryvid Figueroa-Gibson
(74) *Attorney, Agent, or Firm* — Chiwin Law LLC

(57) ABSTRACT

A display substrate and a manufacturing method thereof, and a display apparatus, in the display substrate, the substrate includes a bendable part at an edge of the non-display region away from the display region; the display substrate has a first side and a second side, the extension part is connected with the bendable part and is bent to the second side of the display substrate through the bendable part; at least a part of the first insulation layer is located in the extension part and the first insulation layer includes an opening; the electrically conductive structure is located in the extension part and includes a lower part and an upper part; the opening exposes the lower part; the upper part is on a side of the lower part away from the substrate, located in the opening and is in direct contact with the lower part.

18 Claims, 14 Drawing Sheets

(51) Int. Cl.
*H10K 59/121* (2023.01)
*H10K 59/131* (2023.01)

(52) U.S. Cl.
CPC . *H10K 59/1315* (2023.02); *G09G 2310/0286* (2013.01); *G09G 2330/06* (2013.01)

(58) Field of Classification Search
CPC ............. G09G 2310/08; G09G 3/3266; G09G 2300/0814; G09G 2300/0819; G09G 2320/045; H01L 27/0248; H10K 59/1213; H10K 59/1315; H10K 59/00; G06F 3/041; G09F 9/30
USPC ........................................................ 345/204

See application file for complete search history.

(56) References Cited

U.S. PATENT DOCUMENTS

| | | | |
|---|---|---|---|
| 10,672,858 | B2 | 6/2020 | Lee et al. |
| 11,048,350 | B2 | 6/2021 | Choi et al. |
| 11,257,885 | B2 | 2/2022 | Kim et al. |
| 2005/0264183 | A1 | 12/2005 | Seo et al. |
| 2013/0157399 | A1 | 6/2013 | Park et al. |
| 2019/0036075 | A1* | 1/2019 | Jiang ............... H10K 77/111 |
| 2020/0097116 | A1* | 3/2020 | Choi ............... H10K 50/844 |

FOREIGN PATENT DOCUMENTS

| | | |
|---|---|---|
| CN | 104701348 A | 6/2015 |
| CN | 107179644 A | 9/2017 |
| CN | 107180848 A | 9/2017 |
| CN | 109427862 A | 3/2019 |
| CN | 111048554 A | 4/2020 |
| CN | 111725237 A | 9/2020 |
| CN | 214098387 U | 8/2021 |

* cited by examiner

A-A'

B-B'

C-C'

D-D'

E-E'

A-A'

DISPLAY SUBSTRATE, MANUFACTURING METHOD THEREOF, AND DISPLAY APPARATUS

This application is a U.S. National Phase Entry of International Application No. PCT/CN2021/097532, filed on May 31, 2021, designating the United States of America.

TECHNICAL FIELD

At least one embodiment of the present disclosure relates to a display substrate, a manufacturing method thereof, and a display apparatus.

BACKGROUND

Active Matrix Organic Light-Emitting Diode (AMOLED) displays have the advantages of self-luminescence, wide color gamut, high contrast, and thinness when compared with traditional liquid crystal displays (LCDs). It is widely used in mobile phones, tablet computers and other fields, and it is also widely used in flexible wearable fields such as smart watches. Generally, a pixel circuit is provided in the display region, and a gate driving circuit such as a GOA driving circuit is provided in the non-display region to provide driving signals to the pixel circuit. Usually, an integrated circuit board, a flexible circuit board, etc. are also provided in the non-display region to provide detection signals for the detection of the display substrate and driving signals for the driving circuit.

SUMMARY

At least one embodiment of the present disclosure provides a display substrate, the display substrate includes a display region, a non-display region, and an extension part; the display region includes a display pixel, and the non-display region at least partially surrounds the display region; the display substrate includes: a substrate, a first insulation layer, and an electrically conductive structure. The substrate is located in the display region, the non-display region and the extension part, and the substrate includes a bendable part located at an edge of the non-display region away from the display region; the display substrate has a first side and a second side opposite to the first side, the extension part is connected with the bendable part and is able to be bent to the second side of the display substrate through the bendable part; at least a part of the first insulation layer is located in the extension part and the first insulation layer includes an opening; the electrically conductive structure is located in the extension part and includes: a lower part and an upper part; the opening exposes at least part of the lower part; the upper part is located on a side of the lower part away from the substrate, at least partially located in the opening and is in direct contact with the lower part.

For example, the display substrate provided by at least one embodiment of the present disclosure further comprises: a pixel circuit, a driving circuit and a detection lead wire; the pixel circuit is in the display region and configured to control a display state of the display pixel; at least a part of the driving circuit is in the non-display region, the driving circuit comprises a driving signal line that is at least partially located in the non-display region, and the driving signal line is configured that a driving signal is provided to the pixel circuit; the detection lead wire is electrically connected to the driving signal line and configured to provide a detection signal to the driving signal line, wherein the detection lead wire extends from the non-display region of the display substrate to the extension part of the display substrate region by passing through the bending region, and the detection lead wire comprises a protection part, the electrically conductive structure comprises the protection part; the lower part comprises a first lower part, the opening comprises a first opening, and the first opening exposes at least part of the first lower part; the upper part comprises a first upper part, the first upper part is stacked with the first lower part in a direction perpendicular to the substrate and is on a side of the first lower part away from the substrate, the first upper part is at least partially in the first opening and is in direct contact with the first lower part; and the protection part comprises the first lower part and the first upper part.

For example, in the display substrate provided by at least one embodiment of the present disclosure, an orthographic projection of the first upper part on the substrate substantially coincides with an orthographic projection of the first opening on the substrate.

For example, in the display substrate provided by at least one embodiment of the present disclosure, the first upper part comprises: an inner part and an outer part. The inner part is in the first opening and in direct contact with the first lower part; and the outer part is outside the first opening; the first insulation layer is between the outer part and the first lower part, and a lower surface of the outer part close to the substrate is in direct contact with the first insulation layer.

For example, in the display substrate provided by at least one embodiment of the present disclosure, the first upper part covers the first lower part, and the first upper part and the first lower part are in the first opening.

For example, the display substrate provided by at least one embodiment of the present disclosure further comprises: an integrated circuit board and a first pin. The integrated circuit board is in the extension part and configured to provide the driving signal to the driving circuit; the electrically conductive structure comprises the first pin, the lower part comprises a second lower part, the opening comprises a second opening, and the second opening exposes at least part of the second lower part; the upper part comprises a second upper part, the second upper part is stacked with the second lower part in the direction perpendicular to the substrate and is on a side of the second lower part away from the substrate, the second upper part is at least partially located in the second opening, a lower surface of the second upper part close to the substrate is in direct contact with the second lower part, and an orthographic projection of the second upper part on the substrate is within an orthographic projection of the second opening on the substrate; the first pin comprises the second lower part and the second upper part; the integrated circuit board is provided with an integrated circuit board pin, and an upper surface of the second upper part of the first pin which is away from the substrate is in direct contact with the integrated circuit board pin.

For example, the display substrate provided by at least one embodiment of the present disclosure further comprises: a flexible circuit board and a second pin. The flexible circuit board is in the extension part; at least part of the flexible circuit board is connected to the detection lead wire and configured to provide the detection signal to the detection lead wire, and the flexible circuit board is connected to the integrated circuit board and configured to provide the integrated circuit board with an electrical signal for generating the driving signal; and the second pin is connected to the flexible circuit board and comprises a first part pin, the first part pin is connected to the detection lead wire; the lower part comprises a third lower part, the opening comprises a third opening, and the third opening exposes at least part of the third lower part; the upper part comprises a third upper part, the third upper part is stacked with the third lower part in the direction perpendicular to the substrate and is on a side of the third lower part away from the substrate, at least a part of the third lower part is in the third opening, an lower surface of the third upper part close to the substrate is in direct contact with the third lower part, and an orthographic projection of the third upper part on the substrate substantially coincides with an orthographic projection of the third opening on the substrate; the second pin comprises the third lower part and the third upper part; the flexible circuit board is provided with a flexible circuit board pin, and an upper surface of the third upper part of the second pin which is away from the substrate is in direct contact with the flexible circuit board pin.

For example, in the display substrate provided by at least one embodiment of the present disclosure, the protection part comprises a first protection part, the first lower part comprises a first sub-lower part, the first opening comprises a first sub-opening, and the first sub-opening exposes at least part of the first sub-lower part; the first upper part comprises a first sub-upper part, the first sub-upper part is stacked with the first sub-lower part in the direction perpendicular to the substrate and is on a side of the first sub-lower part away from the substrate, at least a part of the first sub-upper part is in the first sub-opening and is in direct contact with the first sub-lower part; the first protection part comprises the first sub-lower part and the first sub-upper part, the detection lead wire has an end that is in direct contact with the corresponding second pin, and the end has the first protection part.

For example, in the display substrate provided by at least one embodiment of the present disclosure, the protection part comprises a second protection part, the second lower part comprises a second sub-lower part, the first opening comprises a second sub-opening, and the second sub-opening exposes at least part of the second sub-lower part; the second upper part comprises the second sub-upper part, the second sub-upper part is stacked with the second sub-lower part in the direction perpendicular to the substrate and is on a side of the second sub-lower part away from the substrate, at least a part of the second sub-upper is in the second sub-opening and is in direct contact with the second sub-lower part; the second protection part comprises the second sub-lower part and the second sub-upper part; the extension part has an edge opposite to the bendable part and extending along a first direction, the detection lead wire is on at least one side of the integrated circuit board in the first direction, and the detection lead wire comprises a first detection lead wire close to the integrated circuit board, the first detection lead wire has the first protection part and the second protection part, and the second protection part of the first detection lead wire is connected to the first protection part of the first detection lead wire and is on a side of the first protection part of the first detection lead wire away from the second pin.

For example, in the display substrate provided by at least one embodiment of the present disclosure, the second direction is in a same plane as the first direction and intersects with the first direction; the first detection lead wire has an overlapping portion overlapping with the first pin in the second direction, and the overlapping portion comprises the second sub-lower part and the second sub-upper part.

For example, in the display substrate provided by at least one embodiment of the present disclosure, for the first detection lead wire, the overlapping portion is on a side of the end away from the second pin, and the overlapping portion is connected with the second pin through the end.

For example, in the display substrate provided by at least one embodiment of the present disclosure, the first detection lead wire comprises an inclined portion intersecting with the first direction, and the inclined portion comprises the overlapping portion.

For example, in the display substrate provided by at least one embodiment of the present disclosure, the display substrate comprises a plurality of the second pins, and the plurality of second pins are arranged along the first direction; the display substrate comprises a plurality of the detection lead wires, and the first part pins of the plurality of second pins are connected to the plurality of detection lead wires in one-to-one correspondence; the flexible circuit board is provided with a plurality of the flexible circuit board pins, the plurality of flexible circuit board pins are arranged along the first direction, and the plurality of second pins are connected with the plurality of flexible circuit board pins in one-to-one correspondence.

For example, in the display substrate provided by at least one embodiment of the present disclosure, the third upper part of at least one of the plurality of second pins and the first upper part of a corresponding one of the plurality of detection lead wires are an integral structure.

For example, in the display substrate provided by at least one embodiment of the present disclosure, the first pin comprises an input pin and an output pin, both the input pin and the output pin comprise the second upper part and the second lower part; the second upper part of the input pin is electrically connected to the third upper part of the second pin.

For example, in the display substrate provided by at least one embodiment of the present disclosure, the second direction is in a same plane as the first direction and intersects with the first direction, and the flexible circuit board is on a side of the detection lead wire and the integrated circuit board close to an edge of the extension part in the second direction; the display substrate comprises a plurality of the input pins and a plurality of the output pins; in the second direction, a plurality of the input pins, a plurality of the output pins and the plurality of second pins are spaced apart from each other, and the plurality of input pins are between the plurality of the output pins and the plurality of second pins; the display substrate further comprises a plurality of connection electrodes that are arranged in a same layer as the second upper part and the third upper part; the plurality of connection electrodes extend across a gap between the plurality of input pins and the plurality of second pins to electrically connect the second upper parts of the plurality of input pins with the third upper parts of the plurality of second pins in one-to-one correspondence.

For example, in the display substrate provided by at least one embodiment of the present disclosure, the pixel circuit comprises a power line. The power line comprises a portion in the extension part, is configured to provide a power voltage to the pixel circuit, and is electrically connected to a second part pin of a plurality of second pins of the flexible circuit board, the flexible circuit board is configured to provide the power voltage to the pixel circuit; the electrically conductive structure comprises the portion of the power line in the extension part, the lower part comprises a fourth lower part, the opening comprises a fourth opening, and the fourth opening exposes at least part of the fourth lower part; the upper part comprises a fourth upper part, the fourth upper part is stacked with the fourth lower part in the direction perpendicular to the substrate and is on a side of the fourth lower part away from the substrate, at least a part of the fourth upper part is in the fourth opening, an lower surface of the fourth upper part close to the substrate is in direct contact with the fourth lower part, and an orthographic projection of the fourth upper part on the substrate substantially coincides with an orthographic projection of the fourth opening on the substrate; and the portion of the power line in the extension part comprises the fourth upper part and the fourth lower part.

For example, in the display substrate provided by at least one embodiment of the present disclosure, the power line comprises a first power line and a second power line. The first power line is configured to provide a first power voltage to the display pixel; and the second power line is configured to provide a second power voltage to the display pixel; the second power voltage and the first power voltage have opposite polarities; each of the first power line and the second power line comprises a first portion in the extension part, at least one of the first portion of the first power line and the first portion of the second power line comprises the fourth lower part and the fourth upper part.

For example, in the display substrate provided by at least one embodiment of the present disclosure, the display substrate further comprises an electrostatic shielding (ESD) unit, the electrostatic shielding (ESD) unit is in the extension part and configured to shield electrostatic interference of the detection lead wire; the electrically conductive structure comprises the electrostatic shielding unit, the lower part comprises a fifth lower part, the opening comprises a fifth opening, and the fifth opening exposes at least part of the fifth lower part; the upper part comprises a fifth upper part, the fifth upper part is stacked with the fifth lower part in a direction perpendicular to the substrate and is on a side of the fifth lower part away from the substrate, at least a part of the fifth upper part is in the fifth opening, an lower surface of the fifth upper part close to the substrate is in direct contact with the fifth lower part, and an orthographic projection of the fifth upper part on the substrate substantially coincides with an orthographic projection of the fifth opening on the substrate; and the electrostatic shielding unit comprises the fifth lower part and the fifth upper part.

For example, in the display substrate provided by at least one embodiment of the present disclosure, the pixel circuit further comprises a light emitting device, a driving transistor, a data writing transistor, a first gate line and a data line; the data writing transistor is configured to transmit a data signal transmitted through the data line to the driving transistor under control of a first scan signal transmitted through the first gate line, and the driving transistor is configured to control an magnitude of the driving current flowing through the driving transistor according to the data signal, the light emitting device is configured to receive the driving current and be driven by the driving current to emit light; the data line is arranged in a same layer as the upper part.

For example, in the display substrate provided by at least one embodiment of the present disclosure, the first power voltage provided by the first power line is a low potential voltage, and the second power voltage provided by the second power line is a high potential voltage; the first power line further comprises a second portion located in the display pixel of the display region, and the second portion of the first power line is located in a same layer as the upper part.

At least one embodiment of the present disclosure further provides a display apparatus, the display apparatus comprises any one of the above-mentioned display substrates.

At least one embodiment of the present disclosure further provides a manufacturing method of a display substrate, the display substrate comprises a display region, a non-display region and an extension part, the display region comprises a display pixel, and the non-display region at least partially surrounds the display region; the manufacturing method comprises: providing a substrate, in which the substrate is in the display region, the non-display region, and the extension part, and comprises a bendable part at an edge of the non-display region away from the display region; the display substrate has a first side and a second side opposite to the first side, the extension part is connected with the bendable part and is able to be bent to the second side of the display substrate through the bendable part; forming a first insulation layer in at least the extension part and forming an opening in the first insulation layer; forming an electrically conductive structure on the extension part, in which the forming the electrically conductive structure comprises: forming a lower part, in which the opening exposes at least part of the lower part; and forming an upper part, in which the upper part is stacked with the lower part in a direction perpendicular to the substrate and is on a side of the lower part away from the substrate, at least a part of the upper part is in the opening and is in direct contact with the lower part.

For example, in the manufacturing method of the display substrate provided by at least one embodiment of the present disclosure, the step of forming the electrically conductive structure comprises: forming a first electrically conductive material layer; performing a first patterning process on the first electrically conductive material layer to form the lower part; forming a first insulation material layer that covers the lower part, in which the first insulation material layer is in direct contact with the lower part; performing a second patterning process on the first insulation material layer to form an intermediate insulation layer, in which the intermediate insulation layer comprises an opening region, and the opening region exposes at least part of the lower part; forming a second metal material layer on a side of the intermediate insulation layer away from the substrate, in which the second metal material layer comprises a first portion located in the opening region and a second portion located outside the opening region, the first portion is in direct contact with the lower part, an lower surface of the second portion close to the substrate is in direct contact with an upper surface of the first insulation material layer away from the substrate; and performing a third patterning process on the second metal material layer to form the upper part, in which the opening region is configured to form the opening of the electrically conductive structure.

For example, the manufacturing method of the display substrate provided by at least one embodiment of the present disclosure further comprises: forming a second insulation material layer covering the upper part and the opening region, in which the second insulation material layer is in direct contact with the lower part; and performing a fourth patterning process on the second insulation material layer to form the opening and the first insulation layer.

For example, in the manufacturing method of the display substrate provided by at least one embodiment of the present disclosure, the manufacturing method of the display substrate further comprises: forming a pixel circuit, in which the pixel circuit is configured to control a display state of the display pixel; forming a driving circuit, in which at least a part of the driving circuit is located in the non-display region and comprises a driving signal line that is at least partially located in the non-display region, the driving signal line is configured that a driving signal is provided to the pixel circuit; forming a detection lead wire, in which the detection lead wire is electrically connected to the driving signal line and configured to provide a detection signal to the driving signal line, the detection lead wire extends from the non-display region of the display substrate to the extension part of the display substrate region by passing through the bending region, the detection lead wire comprises a protection part, the lower part comprises a first lower part, the opening comprises a first opening, and the first opening exposes at least part of the first lower part; the upper part comprises a first upper part, the first upper part is stacked with the first lower part in the direction perpendicular to the substrate and located on a side of the first lower part away from the substrate, at least a part of the first upper part is located in the first opening and is in direct contact with the first lower part, and the protection part comprises the first lower part and the first upper part; providing an integrated circuit board in the extension part, wherein the integrated circuit board is located in the extension part and is configured to provide the driving signal to the driving circuit, wherein the extension part has an edge extending along a first direction the edge; and forming a first pin in the extension part, wherein the electrically conductive structure comprises the first pin, the lower part comprises a second lower part, and the second opening exposes at least part of the second lower part; the upper part comprises a second upper part, the second upper part is stacked with the second lower part in the direction perpendicular to the substrate and is located on a side of the second lower part away from the substrate, at least a part of the second upper part is located in the second opening, a lower surface of the second upper part close to the substrate is in direct contact with the second lower part, and an orthographic projection of the second upper part on the substrate is located within an orthographic projection of the second opening on the substrate; the first pin comprises the second lower part and the second upper part; the opening region comprises a first opening region, the first opening region exposes the second lower parts of a plurality of the first pins and the first lower part of at least part of the detection lead wire.

For example, in the manufacturing method of the display substrate provided by at least one embodiment of the present disclosure, the manufacturing method of the display substrate further comprises: providing a flexible circuit board in the extension part, in which the flexible circuit board is connected to the detection lead wire and configured to provide the detection signal to the detection lead wire, and the flexible circuit board is connected to the integrated circuit board and configured to provide the integrated circuit board with an electrical signal for generating the driving signal; and forming a second pin on the extension part, wherein the second pin is connected to the flexible circuit board, the second pin comprises a first part pin, and the first part pins is connected to the detection lead wire, in which the electrically conductive structure comprises the second pin, the second pin comprises a third lower part, and the lower part comprises the third lower part; the opening region further comprises a second opening region, the first opening region is connected to and communicated with the second opening region, and the second opening region exposes the third lower part.

For example, in the manufacturing method of the display substrate provided by at least one embodiment of the present disclosure, the protection part comprises a first protection part, the first lower part comprises a first sub-lower part, and the first opening comprises a first sub-opening, and the first sub-opening exposes at least part of the first sub-lower part; the first upper part comprises a first sub-upper part, the first sub-upper part is stacked with the first sub-lower part in the direction perpendicular to the substrate and is located on a side of the first sub-lower part away from the substrate, the first sub-upper part is at least partially located in the first sub-opening and is in direct contact with the first sub-lower part; the first protection part comprises the first sub-lower part and the second sub-upper part; the detection lead wire has an end that is in direct contact with the second pin corresponding thereto, and the end has the first protection part; the first opening region exposes the second lower parts of a plurality of the first pins and a first sub-lower part of the end.

For example, in the manufacturing method of the display substrate provided by at least one embodiment of the present disclosure, the protection part comprises a second protection part, the second lower part comprises a second sub-lower part, the first opening comprises a second sub-opening, and the second sub-opening exposes at least part of the second sub-lower part; the second upper part comprises the second sub-upper part, the second sub-upper part is stacked with the second sub-lower part in the direction perpendicular to the substrate and is located on a side of the second sub-lower part away from the substrate, at least a part of the second sub-upper part is located in the second sub-opening and is in direct contact with the second sub-lower part; the second protection part comprises the second sub-lower part and the second sub-upper part; in the first direction, the detection lead wire is located on one side of the integrated circuit board, a plurality of detection lead wires comprise a first detection lead wire close to the integrated circuit board, the second direction is in a same plane as the first direction and intersects with the first direction, the first detection lead wire has an overlapping portion overlapping with the first pin in the second direction, and the overlapping portion comprises the second sub-lower part and the second sub-upper part; the first opening region exposes the second lower parts of the plurality of first pins and a second sub-lower part of the overlapping portion.

For example, in the manufacturing method of the display substrate provided by at least one embodiment of the present disclosure, for the first detection lead wire, the overlapping portion is located on a side of the end away from the second pin, and the overlapping portion is connected with the second pin through the end.

For example, in the manufacturing method of the display substrate provided by at least one embodiment of the present disclosure, the first opening region comprises a first edge and a second edge. The first edge extends along the first direction as a whole and is a boundary between the first opening region and the second opening region; the second edge intersects with the first edge and overlapping with the first lower part in the direction perpendicular to the substrate; an included angle between the first edge and the second edge defines an included angle region, and the second sub-lower part is located in the included angle region.

For example, in the manufacturing method of the display substrate provided by at least one embodiment of the present disclosure, a planar shape of the first opening region is a first rectangular, and a planar shape of the second opening region is a second rectangle, a length of the first rectangle along the first direction is smaller than a length of the second rectangle along the first direction, and an overall planar shape formed of the first opening region and the second opening region is a T-shape.

For example, in the manufacturing method of the display substrate provided by at least one embodiment of the present disclosure, the integrated circuit board is provided with an integrated circuit board pin, and the flexible circuit board is provided with a flexible circuit board pin; the providing the integrated circuit board on the extension part comprises: bonding the integrated circuit board to the substrate, so that the first pin is in correspondence with the integrated circuit board pin, and an upper surface of the second upper part of the first pin away from the substrate is in direct contact with the corresponding integrated circuit board pin; the providing the flexible circuit board in the extension part comprises: bonding the flexible circuit board to the substrate, so that the plurality of second pins are in one-to-one correspondence with a plurality of the flexible circuit board pins, an upper surface of the third upper part, which is away from the substrate, of each of the plurality of second pins is in direct contact with a corresponding one of the flexible circuit board pins.

For example, in the manufacturing method of the display substrate provided by at least one embodiment of the present disclosure, the manufacturing method of the display substrate further comprises: forming a pixel circuit, the pixel circuit further comprises: a light emitting device, a driving transistor, a data writing transistor, a first gate line and a data line; the data writing transistor is configured to transmit a data signal transmitted through the data line to the driving transistor under control of a first scan signal transmitted through the first gate line, and the driving transistor is configured to control a magnitude of the driving current flowing through the driving transistor according to the data signal, the light emitting device is configured to receive the driving current and be driven by the driving current to emit light; the manufacturing method of the display substrate comprises: performing a third patterning process on the second electrically conductive material layer to form the upper part and the data line.

For example, in the manufacturing method of the display substrate provided by at least one embodiment of the present disclosure, the pixel circuit comprises a first power line and a second power line. The first power line is configured to provide a first power voltage to the display pixel; and the second power line is configured to provide a second power voltage to the display pixel, wherein the first power voltage is a low potential voltage, and the second power voltage is a high potential voltage; the first power line comprises a first portion located in the extension part and a second portion located in the display pixel; the manufacturing method of the display substrate comprises: performing the third patterning process on the second electrically conductive material layer to form the second portion of the first power line.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
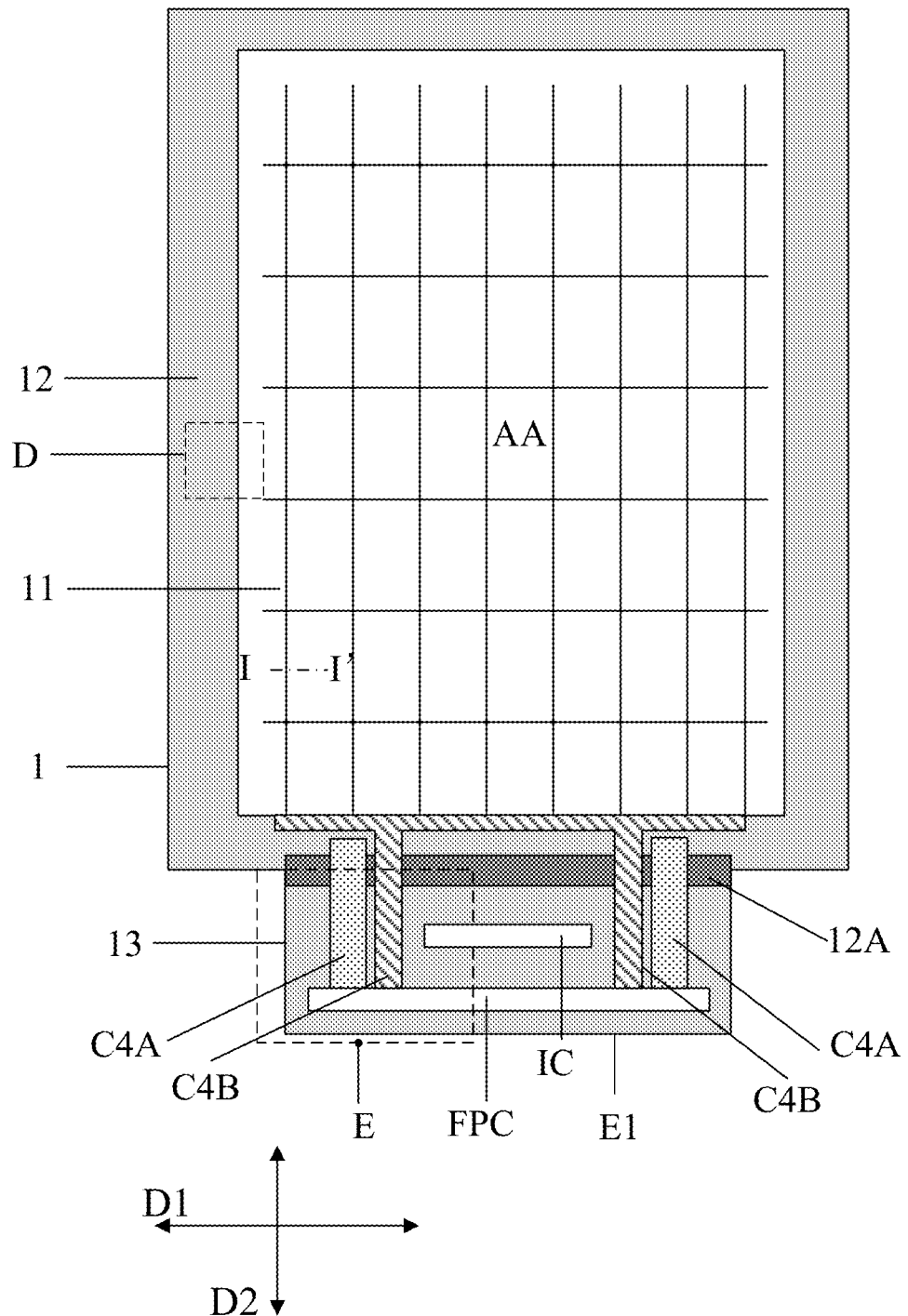
FIG. 1 is a schematic structural diagram of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

At least one embodiment of the present disclosure provides a display substrate, the display substrate includes a display region, a non-display region, and an extension part; the display region includes a display pixel, and the non-display region at least partially surrounds the display region; the display substrate includes: a substrate, a first insulation layer, and an electrically conductive structure. The substrate is located in the display region, the non-display region and the extension part, and the substrate includes a bendable part located at an edge of the non-display region away from the display region; the display substrate has a first side and a second side opposite to the first side, the extension part is connected with the bendable part and is able to be bent to the second side of the display substrate through the bendable part; at least a part of the first insulation layer is located in the extension part and the first insulation layer includes an opening; the electrically conductive structure is located in the extension part and includes: a lower part and an upper part; the opening exposes at least part of the lower part; the upper part is located on a side of the lower part away from the substrate, at least partially located in the opening and is in direct contact with the lower part.

Figure 7A:
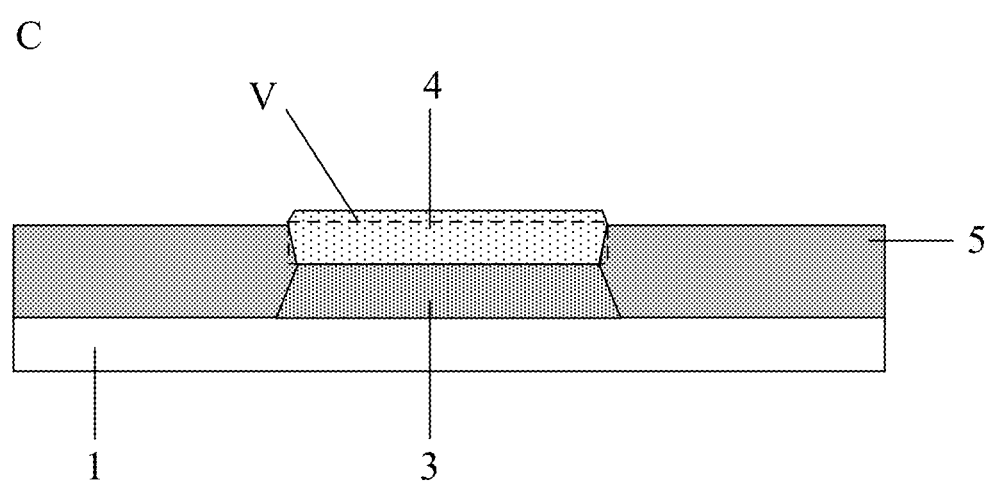
FIG. 7A is a schematic cross-sectional view of an electrically conductive structure provided by an embodiment of the present disclosure.

FIG. 1 is a schematic structural diagram of a display substrate provided by an embodiment of the present disclosure, and FIG. 7A is a schematic cross-sectional view of an electrically conductive structure provided by an embodiment of the present disclosure. As shown in FIG. 1 and FIG. 7A, a display substrate 10 provided by at least one embodiment of the present disclosure includes a display region 11, a non-display region 12, and an extension part 13. The display region 11 includes a display pixel, the non-display region 12 at least partially surrounds the display region 11. For example, the display region 11 includes a plurality of display pixels, for example, the plurality of display pixels are arranged in an array; the non-display region 12 surrounds the entire display region 11. Of course, in other embodiments, the non-display region 12 may surround a part of display region 11. The substrate 1 is located in the display region 11, the non-display region 12 and the extension part 13, and includes a bendable part 12A located at an edge of the non-display region 12 away from the display region 11; the display substrate 10 has a first side for display (i.e., a display side) and a second side opposite the first side (i.e., a non-display side), the extension part 13 is connected to the bendable part 12A and is able to be bent to the second side of the display substrate 10 through the bendable part 12A. An electrically conductive structure C is located in the extension part 13. FIG. 7A takes one conductive structure C as an example, a first insulation layer 5 is at least partially located in the extension part 13 and includes an opening V; the electrically conductive structure C includes a lower part 3 and an upper part 4, and the opening V exposes the lower part 3; the upper part 4 is located on a side of the lower part 3 away from the substrate 1 and at least a part of the upper part 4 is in the opening V and in direct contact with the lower part 3. For example, the display substrate 10 includes a first electrically conductive layer and a second electrically conductive layer, and the second electrically conductive layer is located on a side of the first electrically conductive layer away from the substrate 1. For example, the lower part 3 is located in the first electrically conductive layer, and the upper part 4 is located in the second electrically conductive layer. On one hand, in some embodiments, the lower part 3 and the upper part 4 are lapped each other, that is the lower part 3 and the upper part 4 are stack and in direct contact with each other, thereby reducing the resistance of the overall structure formed by the lower part 3 and the upper part 4; on the other hand, in some embodiments, after the lower part 3 and the first insulation layer 5 which has the opening V exposing the lower part 3 are formed, in the case that a subsequent layer is formed on the lower part 3 and is patterned, it is often necessary to form a protection layer covering the lower part 3 to prevent the lower part 3 from being etched or destroyed during the subsequent patterning process. However, in the display substrate 10 provided by the embodiment of the present disclosure, the upper part 4 covers the lower part 3 and acts as an etching protection layer; and the upper part 4 may be formed together with other conductive structures of the second electrically conductive layer (such as the electrically conductive structures located in the display region 11 and the non-display region 12) by performing one same patterning process on one same layer, and there is no need to form another protection layer, which simplifies the manufacturing process of the display substrate and saves the cost.

For example, the substrate 1 is rigid, such as a glass substrate, a quartz substrate, etc., or the substrate 1 is flexible, such as a polyimide (PI) substrate, etc. The extension part 13 is made from a flexible material, such as polyimide (PI), rubber and other materials.

Figure 5A:
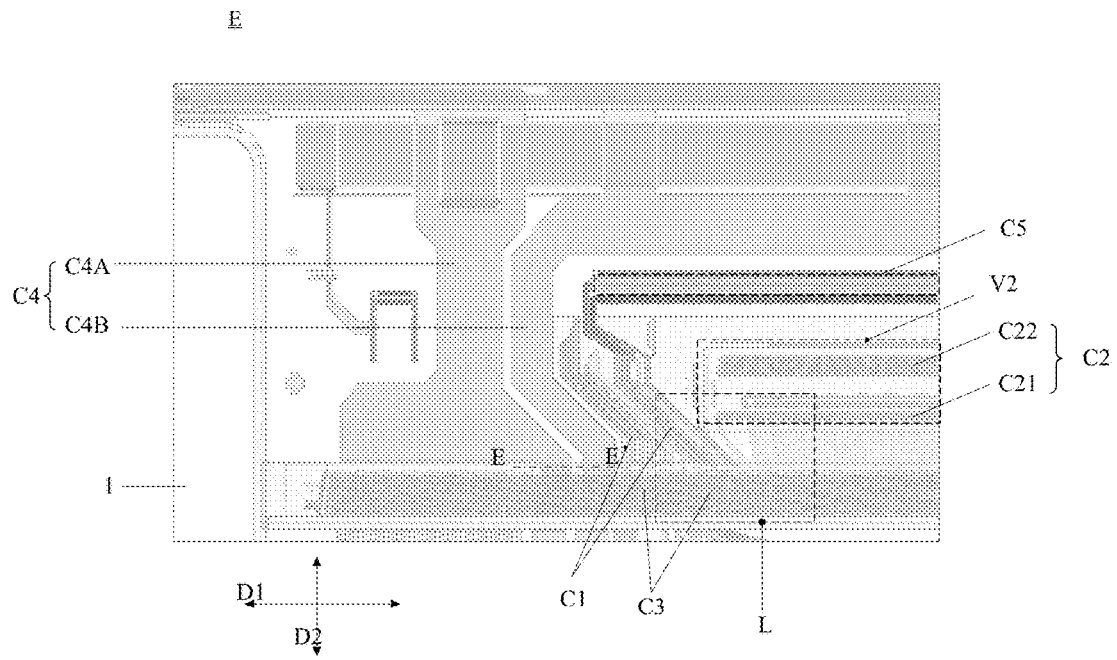
FIG. 5A is an enlarged schematic planar view of a part E including a bendable part and of an extension part of the display substrate shown in FIG. 1, which includes a first electrically conductive layer, a first insulation layer and a second electrically conductive layer.
Figure 6A:
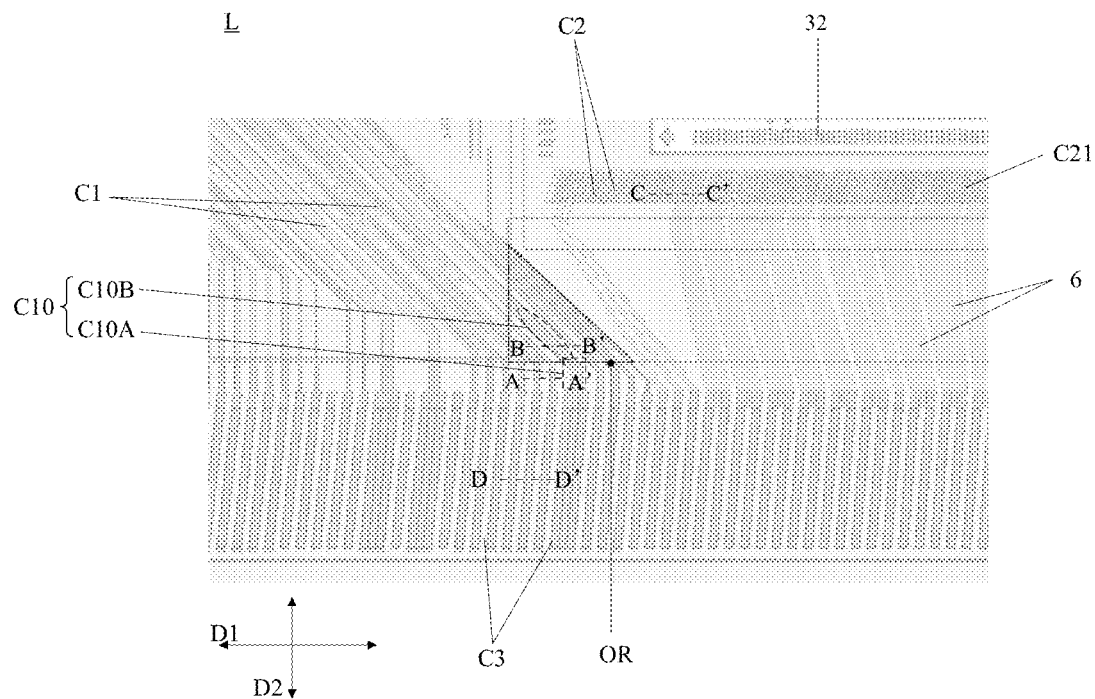
FIG. 6A is an enlarged schematic view of a part L in FIG. 5A, which includes the first electrically conductive layer, the first insulation layer and the second electrically conductive layer.

FIG. 5A is an enlarged schematic planar view of a part E including the bendable part and the extension part of the display substrate shown in FIG. 1. FIG. 6A is an enlarged schematic diagram of a part L in FIG. 5A. FIGS. 5A and 6A show the first electrically conductive layer, the first insulation layer and the second electrically conductive layer, and other layers of the driving circuit and the pixel circuit (such as a layer where a gate electrode is located, a transfer layer for connecting a detection signal line with other layers, etc.) are not shown. For example, the display substrate 10 further includes a pixel circuit and a driving circuit. With reference to FIGS. 5A and 6A, for example, the display substrate 10 further includes a detection lead wire C1. The pixel circuit is located in display region 11 and is configured to control the display state of the display pixel; at least a part of the driving circuit is located in the non-display region 12, and includes a driving signal line located in the non-display region 12; the driving signal line is configured such that a driving signal is provided to the pixel circuit. The detection lead wire C1 is electrically connected to the driving signal line and configured to provide a detection signal to the driving signal line, and the detection lead wire C1 extends from the non-display region 12 of the display substrate 10 to the extension part 13 of the display substrate 10 by passing through the bendable part.

Figure 3A:
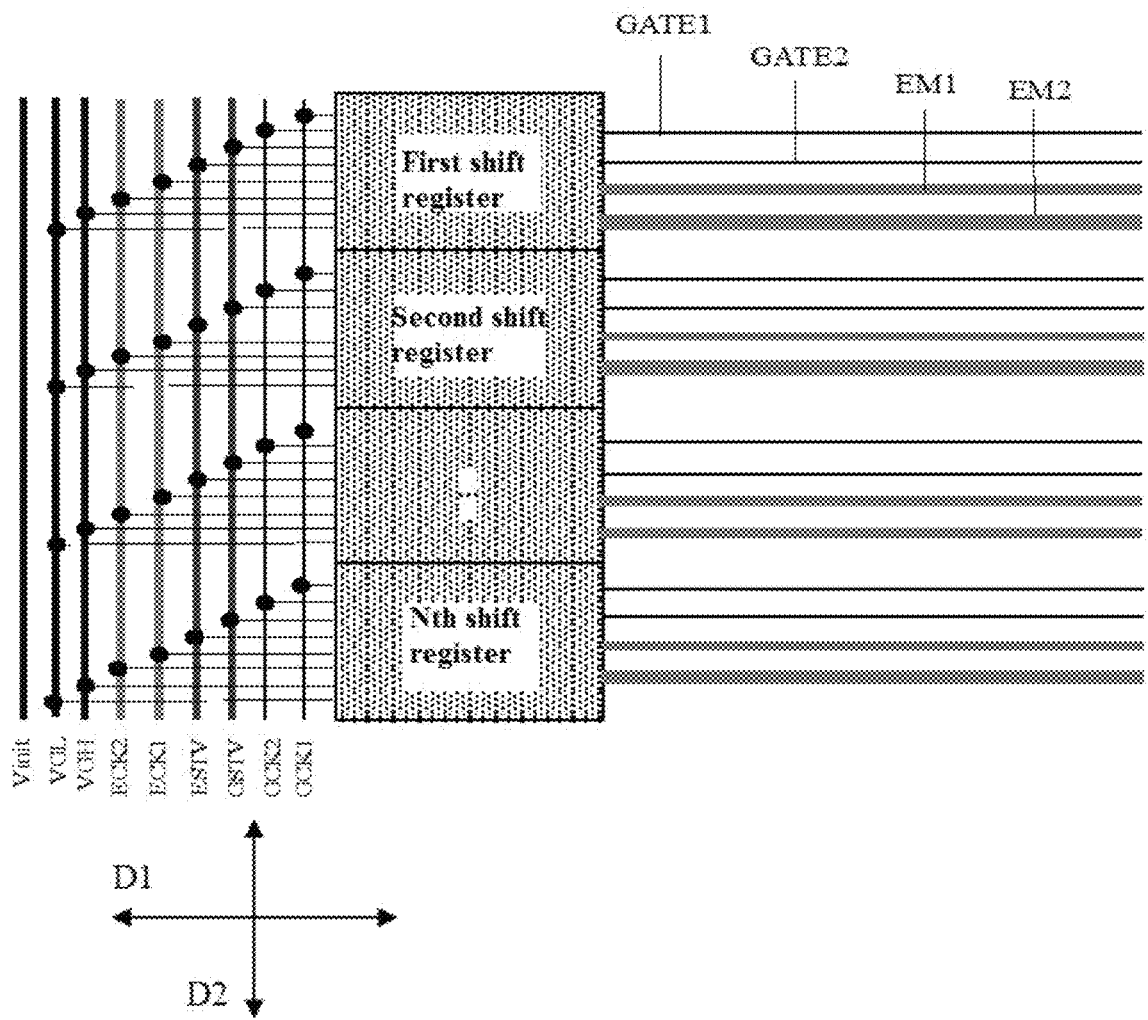
FIG. 3A is a schematic diagram of part D including a driving signal line in FIG. 1.
Figure 3B:
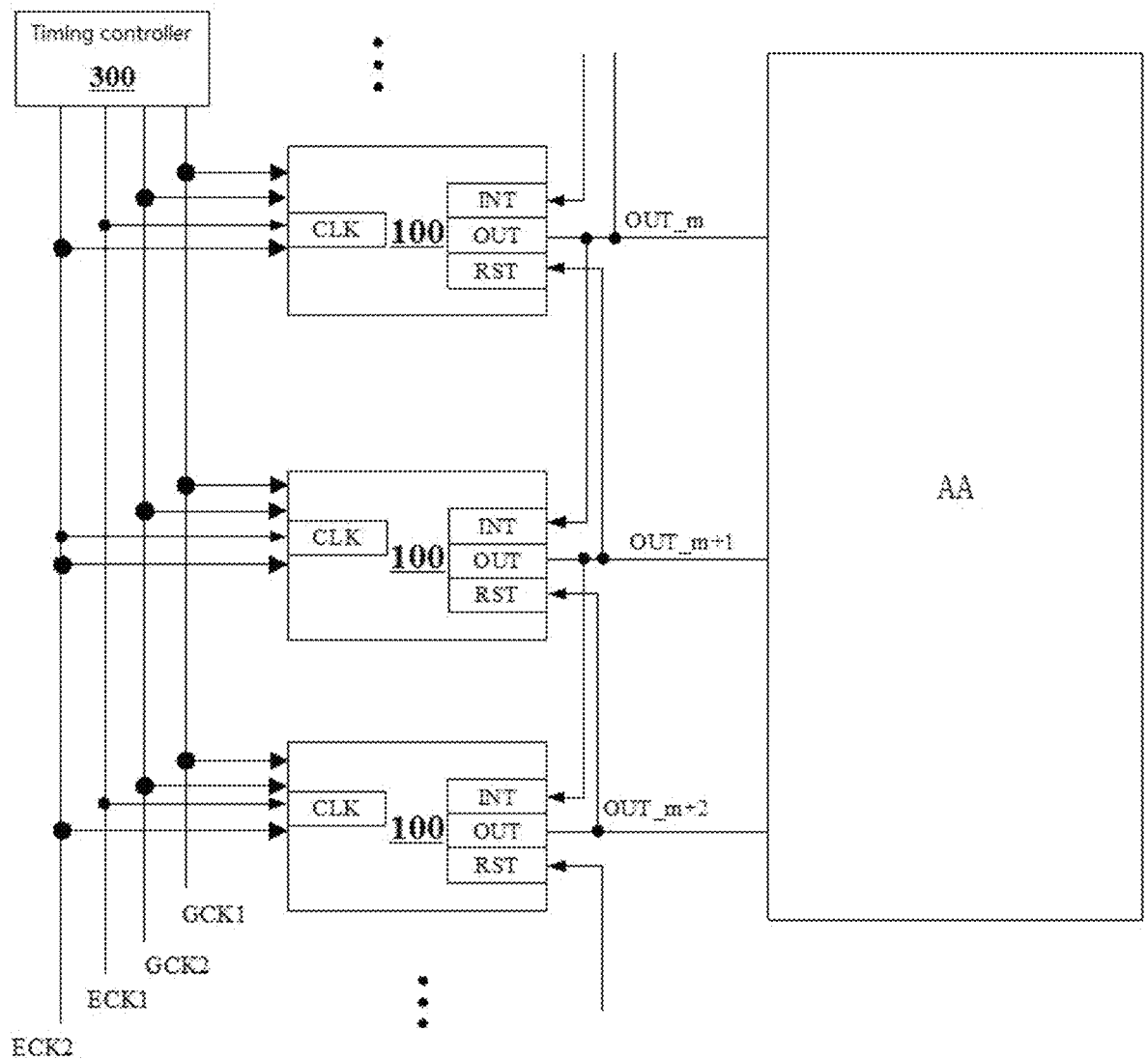
FIG. 3B is a schematic diagram of a clock signal line and a plurality of shift registers.

FIG. 3A is a schematic diagram of a part D including the driving signal line in FIG. 1, FIG. 3B is a schematic diagram of a clock signal line and a plurality of shift registers. As shown in FIG. 3A, the driving signal line 20 in FIG. 1 includes a plurality of signal lines spaced apart from each other. With reference to FIGS. 3A and 3B, the driving circuit includes a gate driving circuit such as a GOA driving circuit; the gate driving circuit includes a plurality of cascaded shift registers and a trigger signal line. The plurality of cascaded shift registers include a first shift register, a second shift register . . . an Nth shift register, and N is a positive integer; each shift register includes a signal input terminal INT and a signal output terminal OUT. The display substrate includes a plurality of display pixels arranged in an array, which includes a plurality of display pixel rows, the plurality of display pixel rows are in one-to-one correspondence with the plurality of cascaded shift registers. The trigger signal line is connected to a signal input terminal of the first shift register and is configured to provide a trigger signal to the first shift register, and the first shift register outputs a corresponding driving signal from its signal output terminal OUT in response to the trigger signal, so as to scan the display pixel row of the display region (AA) corresponding to the first shift register; the aforementioned driving signal line includes the triggering signal line. As shown in FIG. 3B, the driving signal output from the signal output terminal OUT of the previous cascaded shift register is fed into the signal input terminal INT of the next cascaded shift register and used as the trigger signal of the next cascaded shift register. The driving signal line include the trigger signal line.

For example, in some embodiments, as shown in FIG. 3A, the driving signal includes a scan driving signal; the trigger signal line includes a scan trigger signal line GSTV. The scan trigger signal line GSTV is configured to provide a scan trigger signal to the first shift register so that the first shift register outputs a scan driving signal, for example, the scan driving signal is output from a signal output terminal OUT of the first shift register, and the scan driving signal is provided to the pixel circuits.

Figure 4A:
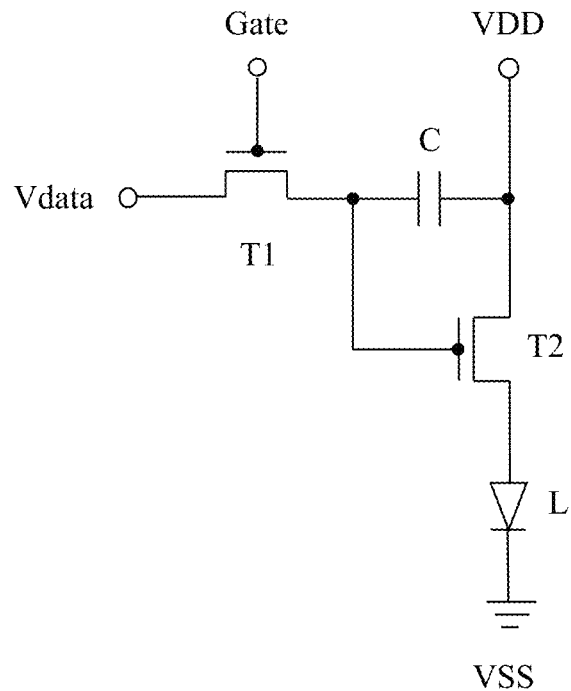
FIG. 4A is an equivalent circuit diagram of a pixel circuit of a display substrate provided by an embodiment of the present disclosure.

FIG. 4A is an equivalent circuit diagram of a pixel circuit of a display substrate provided by an embodiment of the present disclosure. With reference to FIGS. 4A, 3A-3B, for example, the gate driving circuit further includes gate scan lines, for example, including the gate scan line corresponding to each display pixel row. For the gate scan line corresponding to each display pixel row, the gate scan lines are connected to the signal output terminals OUT of the plurality of shift register and are configured to provide the pixel circuits with scan driving signals output from the plurality of shift registers. For example, the pixel circuit shown in FIG. 4A is a 2T1C pixel circuit. The pixel circuit includes: a data line, a light-emitting device, and includes a first transistor T1, a second transistor T2 and a storage capacitor C that are located in each pixel. The data line is configured to provide a data signal for the display pixel, for example, the data signal is data voltage signal. The light emitting device L includes a first electrode and a second electrode, a first power line 31 (VSS) is connected to the first electrode to receive a first power voltage; a gate electrode of the first transistor T1 is connected to the gate scan line to receive the scan driving signal, a first electrode of the first transistor T1 is connected to the data line to receive the data signal, the second electrode of the first transistor T1 is connected to the gate electrode of the second transistor T2; a first electrode of the second transistor T2 is connected to a second power line 32 (VDD) to receive a second power voltage, and a second electrode of the second transistor T2 is connected to the second electrode of the light-emitting device L. A first electrode of the storage capacitor C is connected to a gate electrode of the second transistor T2, and a second electrode of the storage capacitor C is connected to the second power line 32 (VDD). For example, the first transistor T1 and the second transistor T2 are both N-type transistors. For example, when the N-type transistor is adopted, IGZO is used as an active layer of the thin film transistor to reduce the size of the driving transistor and prevent leakage current. For example, the N-type transistor is turned on in response to a high level signal.

For example, for the embodiment shown in FIG. 4A, the scan trigger signal is input to the first cascaded shift register through the scan trigger signal line, so that the scan driving signal is output from the first cascaded shift register and is provided to the pixel circuits through the gate scan line.

In other embodiments of the present disclosure, the type of the pixel circuit is not limited to the 2T1C circuit, for example, it may also be any implementable type of the pixel circuit, such as 4T2C or 7T1C and the like.

For example, in some embodiments, the driving signal further includes a light emission control driving signal; the trigger signal line further includes a light emission control trigger signal line ESTV, and the light emission control trigger signal line ESTV is configured to provide a light emission control trigger signal to the first shift register to enable the first shift register to outputs the light emission control driving signal, and the light emission control driving signal is provided to the pixel circuit. This will be described below by taking the case where the display substrate adopts a 7T1C pixel circuit as an example.

Figure 4B:
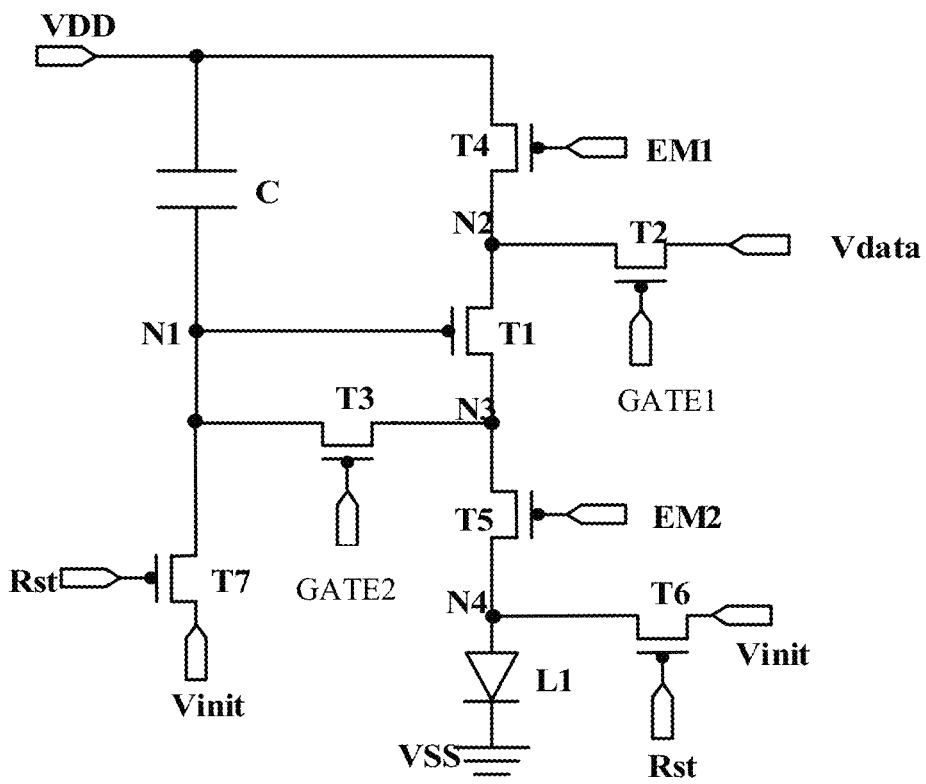
FIG. 4B is an equivalent circuit diagram of another pixel circuit of a display substrate provided by an embodiment of the present disclosure.

Exemplarily, FIG. 4B is an equivalent circuit diagram of another pixel circuit of a display substrate provided by an embodiment of the present disclosure, and the pixel circuit shown in FIG. 4B is a 7T1C pixel circuit. With reference to FIGS. 4B and 3A-3B, the scan driving signal includes a first scan driving signal and a second scan driving signal, and the light control driving signal includes a first lighting control driving signal, a second lighting control driving signal and a reset driving signal. The gate driving circuit further includes a first scan line GATE1, a second scan line GATE2, a first light emission control line EM1 and a second light emission control line EM2. These four kinds of signal lines are correspondingly arranged for each display pixel row. For each display pixel row, the first scan line GATE1 and the second scan line GATE2 are connected to the signal output terminal OUT of the shift register and are configured to provide the first scan driving signal and the second scan driving signal that are output from the shift register to the pixel circuit; the first light emission control line EM1 and the second light emission control line EM2 are connected to the signal output terminal OUT of the shift register and configured to provide the first light emission control driving signal and the second light emission control driving signal, output from the shift register, to the pixel circuit. For example, the pixel circuit includes: a data line, a light emitting device L1, an initial signal line Vinit, and includes a first transistor T1, a second transistor T2, a third transistor T3, a fourth transistor T4, a fifth transistor T5, a sixth transistor T6, a seventh transistor T7 and a storage capacitor C that are located in each pixel. The data line is configured to provide a data signal Vdata to the display pixel, for example, the data signal Vdata is a data voltage; the light emitting device L1 includes a first electrode and a second electrode, and a first power line (VSS) is connected to the first electrode to receive the first power voltage; an initial signal line Vinit is configured to provide an initial signal to the display pixel. A gate electrode of the first transistor T1 is connected to a first node N1; a first electrode of the first transistor T1 is connected to a second node N2, and the second electrode of the first transistor T1 is connected to the third node N3; a gate electrode of the second transistor T2 is connected to the first scan line GATE1 to receive the first scan driving signal, a first electrode of the second transistor T2 is connected to the data line to receive the data signal Vdata, and a second electrode of the second transistor T2 is connected to the second node N2; a gate electrode of the third transistor T3 is connected to the second scan line GATE2 to receive the second scan driving signal, a first electrode of the third transistor T3 is connected to the first node N1 (i.e., the gate electrode of the first transistor T1), and a second electrode of the third transistor T3 is connected to the third node N3; a first electrode of the storage capacitor C is connected to the first node N1 (i.e., the gate electrode of the first transistor T1), and a second electrode of the storage capacitor C is connected to the second power line 32 (VDD) to receive the second power voltage; a gate electrode of the fourth transistor T4 is connected to the first light-emitting control line EM1 to receive the first light-emitting control driving signal, and a first electrode of the fourth transistor T4 is connected to the second power line 32 (VDD) is connected to receive a second power voltage, a second electrode of the fourth transistor T4 is connected to the second node N2; a gate electrode of the fifth transistor T5 is connected to the second light-emitting control line EM2 to receive the second light-emitting control driving signal, a first electrode of the fifth transistor T5 is connected to the third node N3, a second electrode of the fifth transistor T5 is connected to the second electrode of the light emitting device L1; a gate electrode of the sixth transistor T6 is connected to a reset control terminal to receive a reset driving signal, a first electrode of the sixth transistors T6 is connected to an initial signal line Vinit to receive an initial signal, a second electrode of the sixth transistor T6 is connected to the second electrode of the light emitting device L1; a gate electrode of the seventh transistor T7 is connected to the reset control terminal to receive the reset driving signal, a first electrode of the seventh transistor T7 is connected to the initial signal line Vinit to receive the initial signal, and a second electrode of the seventh transistor T7 is connected to the first node N1.

For example, in the embodiment shown in FIG. 4B, the first to seventh transistors T1~ T7 are all N-type transistors. For example, in the case that an N-type transistor is adopted, IGZO is used as the material of the active layer of the thin film transistor to reduce the size of the driving transistor and prevent leakage current. The N-type transistor is turned on in response to a high level signal. For example, in other embodiments, the pixel circuit may adopt a pixel circuit that mixes N-type and P-type transistors, for example, the third transistor T3 and the seventh transistor T7 adopt N-type transistors, and the rest of the transistors adopt P-type transistors, because the N-type transistor has low leakage current, so the screen flicker phenomenon can be overcome in the case that the pixel circuit is used for low frequency driving. In addition, because the third transistor T3 of the compensation circuit in the pixel circuit adopts an N-type transistor with a lower leakage current and a smaller size, the storage capacitor C of the compensation circuit may adopt a smaller size capacitor, thereby increasing the resolution of the display panel, and at the same time, because the leakage current of the N-type transistor is small, there is no need to consider the aging problem of the N-type transistor. For example, with reference to FIG. 1, FIG. 3A and FIG. 4B, the driving signal line further includes an initial signal line Vinit, and the initial signal line Vinit extends from the non-display region 12 to the display region 11, for example, the initial signal line Vinit passes through where the shift register is located and extends to the display region 11, so as to connect to the first electrode of the sixth transistor T6 and the first electrode of the seventh transistor T7 and to provide them with an initial signal, that is, to reset the node N1 and the fourth node N4 of the previous stage before proceeding to the next display stage.

For example, as shown in FIGS. 3A-3B, the driving signal line further includes a clock signal line configured to provide a clocked driving signal to each shift register so that the scan driving signal and the light emission control driving signal are provided to the pixel circuit. For example, the clock signal line includes a first scan clock signal line GCLK1, a second scan clock signal line GCLK2, a first light emission control clock signal line ECLK1 and a second light emission control clock signal line ECLK2, these four kinds of clock signal line respectively provide the first scan clock signal, the second scan clock signal, the first light emission control clock signal and the second light emission control clock signal to the shift register, and the shift register outputs the first scan driving signal, the second scan driving signal, the first light emission control driving signal and the second light-emitting control driving signals, and these output signals are provided to the pixel circuit through the first scan line, the second scan line, the first light-emitting control line and the second light-emitting control line respectively, that is, the clock signal line is configured to allow the first scan driving signal, a second scan driving signal, a first light emission control driving signal and a second light emission control driving signal to be respectively provided to the pixel circuit through the shift register.

For example, as shown in FIGS. 3A-3B, the driving signal line further include a low-level signal line VGL and a high-level signal line VGH. The low-level signal line VGL is connected to each shift register and is configured to provide a first voltage driving signal to each shift register; the high-level signal line VGH is connected to each shift register and configured to provide a second voltage driving signal to each shift register, the second voltage is greater than the first voltage, in order to provide a power voltage for the operation of each shift register.

For the embodiment shown in FIG. 4B, a power circuit of the display substrate provides the scan trigger signal to the scan trigger signal line, provides the light emission control trigger signal to the light emission control trigger signal line, and provides clock control driving signals to the first scan clock signal line GCLK1, the second scan clock signal line GCLK2, the first light emission control clock signal line ECLK1 and the second light emission control clock signal line ECLK2, respectively. In addition, a second power circuit 6 provides a first voltage driving signal to the low-level signal line VGL and a second voltage driving signal to the high-level signal line VGH, and the first voltage driving signal and the second voltage driving signal are provided to the shift register through the low level signal line VGL and the high-level signal line VGH, respectively.

It should be noted that the driving signal line is not limited to the type listed above, and may further include signal lines with other functions, and the type of driving signal line listed in the above embodiments are only exemplary.

Figure 2:
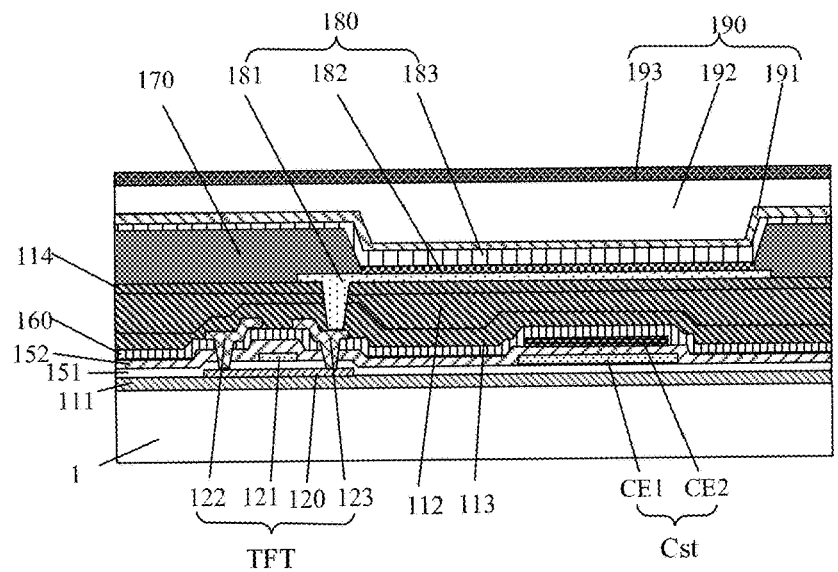
FIG. 2 is a schematic cross-sectional view of the display region of the display substrate in FIG. 1 taken along the line I-I'.

FIG. 2 is a schematic cross-sectional view of the display region of the display substrate in FIG. 1 taken along the line I-I'. As shown in FIG. 2, the pixel circuit of each sub-pixel in the display region 11 of the display substrate includes a thin film transistor (TFT), a light emitting element 180 and a storage capacitor Cst. The thin film transistor includes an active layer 120, a gate electrode 121, and source and drain electrodes 122/123; the storage capacitor Cst includes a first electrode plate CE1 and a second electrode plate CE2. The light emitting element 180 includes a cathode 183, an anode 181, and a light emitting layer 182 between the cathode 183 and the anode 181. The anode 181 is electrically connected to one of the source and drain electrodes 122/123 of the thin film transistor TFT, such as the drain electrode 123. Of course, in other embodiments, the anode 181 and the drain electrode 123 of the thin film transistor TFT may also be electrically connected through a transfer electrode. For example, the light-emitting element may be, for example, an organic light-emitting diode (OLED) or a quantum dot light-emitting diode (QLED). Accordingly, the light-emitting layer 182 is an organic light-emitting layer or a quantum dot light-emitting layer.

For example, the first power line and the second electrode plate CE2 of the storage capacitor Cst are arranged in the same layer. The structures disposed in the same layer may be formed by a same patterning process, thereby simplifying the manufacturing process of the display substrate 20. Alternatively, each first power line includes a first portion arranged in the same layer as the gate electrode 121 and the first electrode plate CE1 of the storage capacitor Cst, and a second portion arranged in the same layer as the second electrode plate CE2 of the storage capacitor Cst. The first portion and the second portion which are arranged in different layers are electrically connected through a via hole, so that the first portion and the second portion are connected in parallel to reduce the resistance of each first power line.

For example, the second electrode plate CE2 of the storage capacitor Cst is located in the first electrically conductive layer, that is, the second electrode plate CE2 and the lower part of the electrically conductive structure provided by the embodiment of the present disclosure are in the same layer and may be formed of the same electrically conductive material layer by using a same patterning process; the source and drain electrodes 122/123 and the data line of the thin film transistor TFT are located in the second electrically conductive layer, that is, the source and drain electrodes 122/123, the data line, and the upper part of the electrically conductive structure are in the same layer and may be formed of the same electrically conductive material layer by using a same patterning process. For another example, in some embodiments, the lower part of the electrically conductive structure provided by the embodiments of the present disclosure is in the same layer as the second power line VDD of the pixel circuit (for example, the second power line VDD connected to the second voltage terminal in FIG. 4B) and the source and drain electrodes 122/123, and the upper part of the electrically conductive structure provided by the embodiments of the present disclosure is in the same layer as the data line; alternatively, the lower part of the electrically conductive structure provided by the embodiments of the present disclosure is in the same layer as the data line and the source and drain electrodes 122/123, the upper part of the electrically conductive structure provided by the embodiments of the present disclosure is in the same layer as the second power line VDD.

For example, as shown in FIG. 2, the display region 11 further includes a first gate insulation layer 151 located between the active layer 120 and the gate electrode 121, a second gate insulation layer 152 located above the gate electrode 121, and an intermediate insulation layer 160, the second gate insulation layer 152 is located between the first electrode plate CE1 and the second electrode plate CE2, so that the first electrode plate CE1, the second gate insulation layer 152 and the second electrode plate CE2 constitute the storage capacitor Cst. The intermediate insulation layer 160 covers the second capacitor plate CE2.

For example, as shown in FIG. 2, the display region 11 further includes an insulation layer 113 (e.g., a passivation layer) covering the pixel circuit and a first planarization layer 112. The display region 201 further includes a pixel defining layer 170 for defining a plurality of sub-pixels and spacers (not shown) or other structures on the pixel defining layer 170. As shown in FIG. 2, in some embodiments, the insulation layer 113 is located above the source and drain electrodes 122/123 (for example the passivation layer, which is formed of silicon oxide, silicon nitride or silicon oxynitride, etc.), the first planarization layer 112 is disposed above the insulation layer 113, and the anode 181 is electrically connected to the drain electrode 123 through a via hole penetrating the first planarization layer 112 and the insulation layer 113.

For example, as shown in FIG. 2, the display substrate further includes an encapsulation layer 190, and the encapsulation layer 190 includes a plurality of encapsulation sub-layers 191/192/193. For example, a first encapsulation layer 291 and the first encapsulation sub-layer 191 in the encapsulation layer 190 are arranged in the same layer, a second encapsulation layer 292 and the second encapsulation sub-layer 192 in the encapsulation layer 190 are arranged in the same layer, and a third encapsulation layer 293 and the third encapsulation sub-layer 193 in the encapsulation layer 190 are arranged in the same layer; for example, the first encapsulation layer 291 and the third encapsulation layer 293 both include an inorganic encapsulation material, such as silicon oxide, silicon nitride or silicon oxynitride, etc. The second encapsulation layer 292 may include an organic material, such as resin material and the like. The multi-layer encapsulation structure of the display substrate can achieve a better encapsulation effect to prevent impurities such as water vapor or oxygen from entering the interior of the display substrate.

In some embodiments, as shown in FIG. 2, the display substrate further includes a buffer layer 111 on the substrate 210. The buffer layer 111 acts as a transition layer, thereby preventing harmful substances in the substrate 1 from invading the interior of the display substrate, such as entering the display region 11, and increasing the adhesion between the layer in the display substrate and the substrate 1. For example, the material of the buffer layer 111 includes a single-layer or multi-layer structure formed of insulating materials such as silicon oxide, silicon nitride, and silicon oxynitride.

Figure 6B:
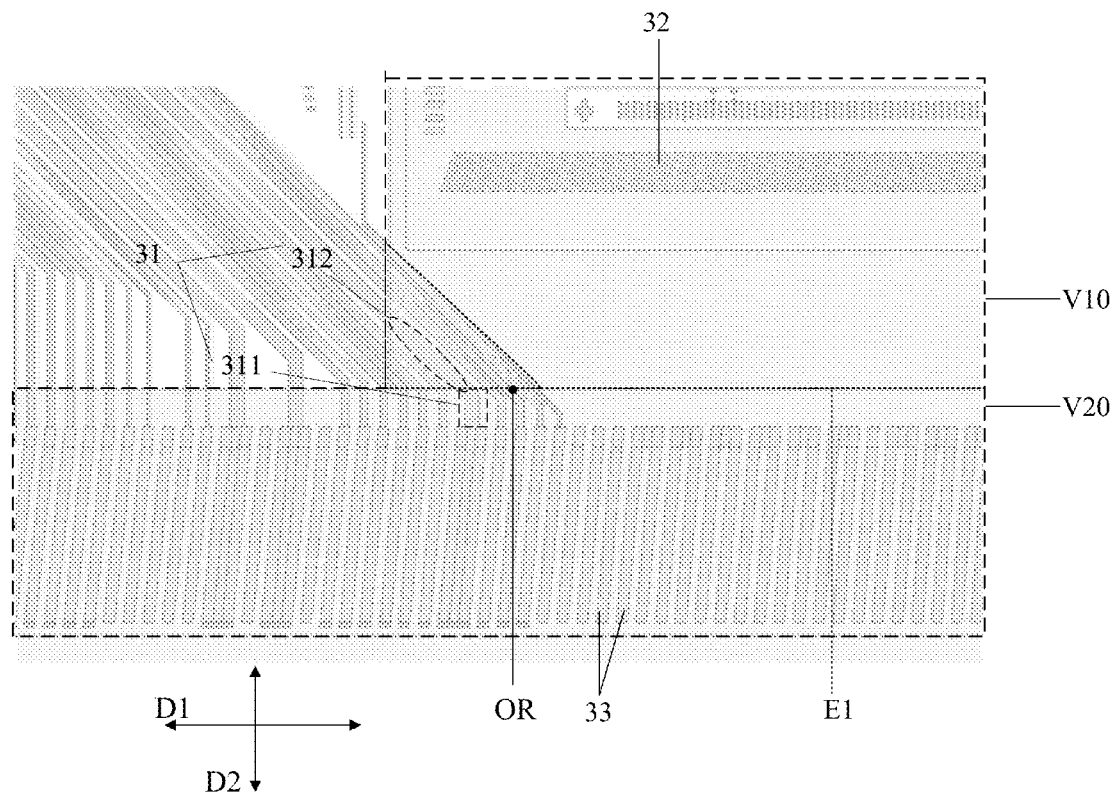
FIG. 6B is a schematic structural diagram of the display substrate after forming the first electrically conductive layer in FIG. 6A and performing a second patterning process on the first insulation material layer to form an opening region during the manufacturing process of the display substrate.
Figure 6C:
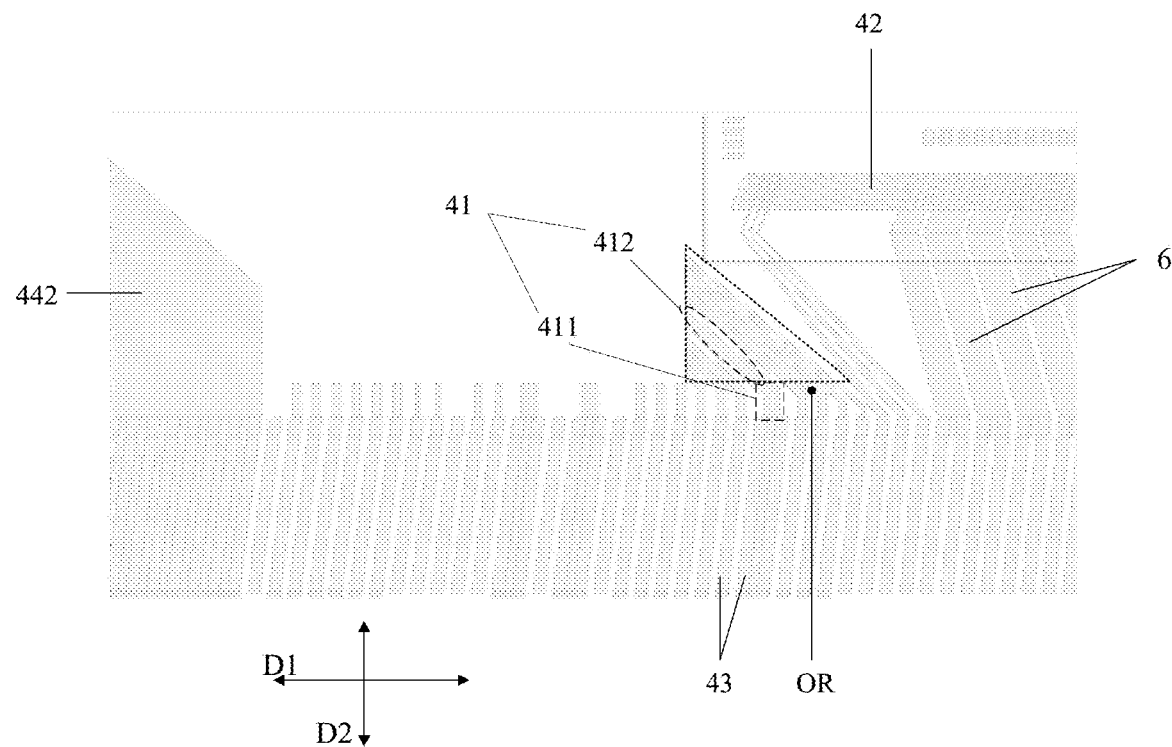
FIG. 6C is a schematic planar view of the second electrically conductive layer in FIG. 6A.

For example, the detection lead wire C1 includes a protection part C10 (as shown in FIG. 6A), the aforementioned electrically conductive structure C includes the aforementioned protection part C10, and the protection part C10 is an example of the aforementioned electrically conductive structure C. FIG. 6B is a schematic structural diagram of the display substrate after forming the first electrically conductive layer in FIG. 6A and performing a second patterning process on the first insulation material layer to form an opening region during the manufacturing process of the display substrate; FIG. 6C is a schematic planar view of the second electrically conductive layer in FIG. 6A. With reference to FIGS. 6A-6C, the lower part of the electrically conductive structure includes a first lower part 31, the opening of the electrically conductive structure includes a first opening, and the first opening exposes the first lower part 31; the upper part includes a first upper part 41, the first upper part 41 is stacked with the first lower part 31 in a direction perpendicular to the substrate 1 and is located on a side of the first lower part 31 away from the substrate 1, and at least a part of the first upper part 41 is located in the first opening and is in direct contact with the first lower part 31; and the protection part C10 includes a first lower part 31 and a first upper part 41. As shown in FIG. 6A, the protection part C10 includes a first protection part C10A and a second protection part C10B, the first protection part C10A and the second protection part C10B are respectively two examples of the aforementioned electrically conductive structure C, which will be described in details in the following description. It should be noted that, in the display substrate 10, not only the detection lead wire may include the electrically conductive structure C, but other wires may also include the electrically conductive structure C, and the detection lead wire is taken as an example here. Moreover, the wire of FIG. 6A electrically connected to the flexible circuit board FPC is used as an example of the detection lead wire, and the wires electrically connected to the flexible circuit board FPC may also be wires with other functions.

For example, with reference to FIG. 1, FIG. 5A, and FIG. 6A, the display substrate 10 further includes an integrated circuit board IC and a first pin C2. The integrated circuit board IC is located in the extension part 13 and configured to provide a driving signal to the driving circuit. The extension part 13 has an edge μl extending along the first direction D1. The aforementioned electrically conductive structure C includes the first pin C2, and the first pin C2 is another example of the electrically conductive structure C. FIG. 7D is a schematic cross-sectional view taken along line C-C' in FIG. 6A, and FIG. 7D takes two first pins C2 spaced apart from each other as an example. With reference to FIG. 7D, the lower part of the electrically conductive structure includes a second lower part 32, the opening of the electrically conductive structure includes a second opening V2, and the second opening V2 exposes the second lower part 32; the upper part of the electrically conductive structure includes a second upper part 42, the second upper part 42 is stacked with the second lower part 32 in the direction perpendicular to the substrate 1 and is located on a side of the second lower part 32 away from the substrate 1, at least a part of the second upper part 42 is located in the second opening V2, a lower surface of the second upper part 42 close to the substrate 1 is in direct contact with the second lower part 32, and an orthographic projection of the second upper part 42 on the substrate 1 is located within an orthographic projection of the second opening V2 on the substrate 1; the first pin C2 includes the second lower part 32 and the second upper part 42. The integrated circuit board IC is provided with an integrated circuit board pin (not shown in the figure), and an upper surface of the second upper part 42 of the first pin C2 away from the substrate 1 is in direct contact with the integrated circuit board pin. That is, the integrated circuit board IC is bonded to the region where the first pin C2 is located, so that the upper surface of the second upper part 42 of the first pin C2 away from the substrate 1 is in direct contact with the integrated circuit board pin, that is, the upper surface of the second upper part 42 away from the substrate 1 in FIG. 7D is in direct contact with the integrated circuit board pin. In this way, due to that the second upper part 42 and the second lower part 32 are stacked and lapped with each other, and are in direct contact with each other, the step difference, that is, the height difference in the direction perpendicular to the substrate, between the second lower part 32 and the integrated circuit board pin on the integrated circuit board IC is reduced, so that the entirety structure constituted by the second upper part 42 and the second lower part 32 realizes better direct contact and connection with the integrated circuit board pin.

For example, with reference to FIGS. 5A and 7D, the second opening V2 exposes the entire region for arranging the integrated circuit board IC, that is, exposes the entire region where the plurality of first pins C2 spaced apart from each other are located. Thus, as shown in FIG. 7D, there is no first insulation layer between the adjacent first pins C2 in the first direction.

For example, with reference to FIG. 1, FIG. 5A, and FIG. 6A, the display substrate 10 further includes a flexible circuit board FPC and a plurality of second pins C3. The aforementioned electrically conductive structure C includes the second pins C3, and each second pin C3 is another example of the electrically conductive structure C. The flexible circuit board FPC is located in the extension part 13, connected to the detection lead wire C1 and configured to provide the detection signal to the detection lead wire C1, and the flexible circuit board FPC is connected to the integrated circuit board IC and configured to provide the integrated circuit board IC with an electrical signal for generating the driving signal. The second pins C3 are connected to the flexible circuit board FPC and include the first part pins, each of the first part pins is connected to the detection lead wire. For example, the flexible circuit board FPC further provides the data signal, and the data signal is provided to the pixel circuit through the IC. Of course, the flexible circuit board FPC may further provide other signals, which may be designed by those skilled in the art according to specific requirements, which is not limited in the present disclosure.

For example, the display substrate 10 includes a plurality of second pins C3, and the plurality of second pins C3 are arranged along the first direction D1; the display substrate 10 includes a plurality of detection lead wires C1, a part of the plurality of second pins C3 are the first part pins (for example, the part of the second pins C3 that are close to the first pins C2 in the first direction D1 in FIG. 5A and FIG. 6A), and the first part pins are connected to the plurality of detection lead wires C1 in one-to-one correspondence. For example, the flexible circuit board FPC is provided with a plurality of flexible circuit board pins, the plurality of flexible circuit board pins are arranged along the first direction D1, and the plurality of second pins C3 are connected to the plurality of flexible circuit board pins in one-to-one correspondence.

Figure 7B:
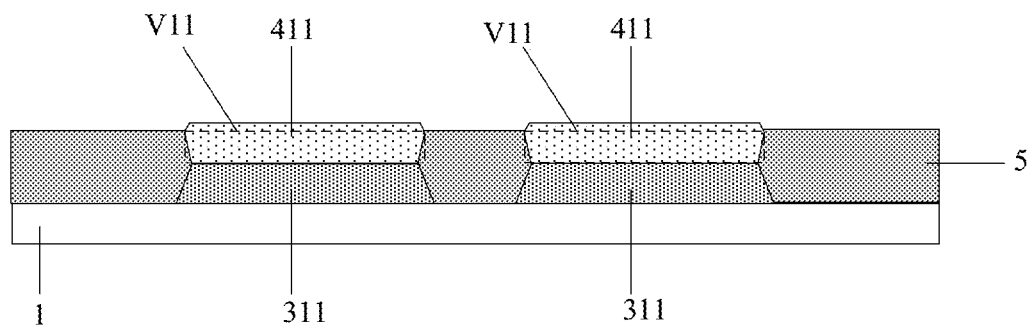
FIG. 7B is a schematic cross-sectional view taken along line A-A' in FIG. 6A.
Figure 7C:
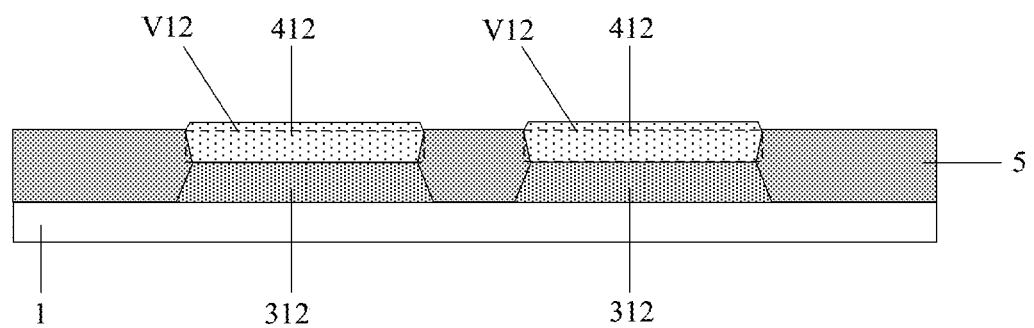
FIG. 7C is a schematic cross-sectional view taken along line B-B' in FIG. 6A.
Figure 7D:
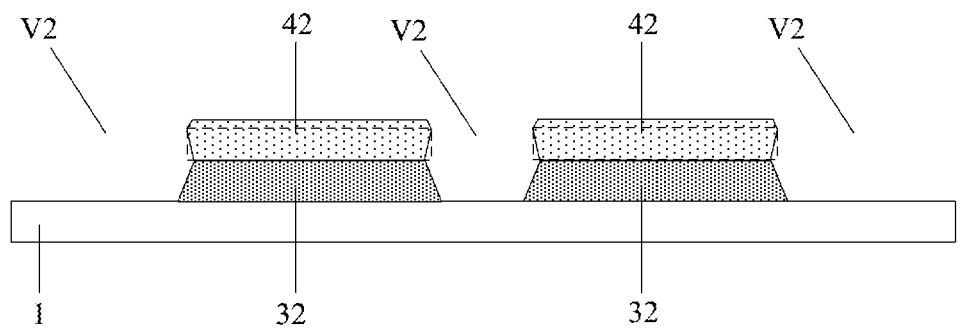
FIG. 7D is a schematic cross-sectional view taken along line C-C' in FIG. 6A.
Figure 7E:
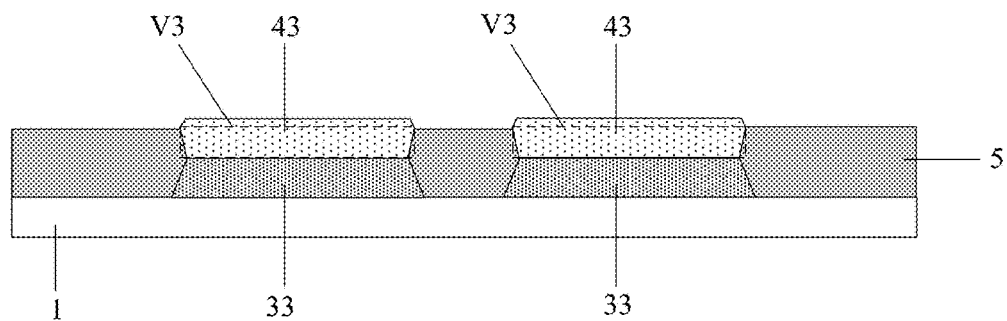
FIG. 7E is a schematic cross-sectional view taken along line D-D' in FIG. 6A.

FIG. 7E is a schematic cross-sectional view taken along line D-D' in FIG. 6A, and FIG. 7E takes two second pins C3 spaced apart from each other as an example. With reference to FIG. 7E, the lower part of the electrically conductive structure includes a third lower part 33, the opening of the electrically conductive structure includes a third opening V3, and the third opening V3 exposes the third lower part 33; the upper part of the electrically conductive structure includes a third upper part 43, the third upper part 43 is stacked with the third lower part 33 in the direction perpendicular to the substrate 1 and is located on a side of the third lower part 33 away from the substrate 1, at least a part of the third upper part 43 is located in the third opening V3, a lower surface of the third upper part 43 close to the substrate 1 is in direct contact with the third lower part 33, and an orthographic projection of the third upper part 33 on the substrate 1 substantially coincides with an orthographic projection of the third opening V3 on the substrate 1; the second pin C3 includes the third lower part 33 and third upper part 43. The flexible circuit board FPC is provided with flexible circuit board pins (not shown in the figure). As shown in FIG. 7E, an upper surface of the third upper part 43 of the second pin C3 away from the substrate 1 is in direct contact with the flexible circuit board pins. That is, the flexible circuit board FPC is bonded to the region where the second pin C3 is located, so that the upper surface of the third upper part 43 of the second pin C3 away from the substrate 1 is in direct contact with the flexible circuit board pins. In this way, due to that the third upper part 43 and the third lower part 33 are stacked and lapped with each other and are in direct contact with each other, the step difference, that is, the height difference in the direction perpendicular to the substrate, between the third lower part 33 and the flexible circuit board pins on the flexible circuit board FPC is reduced, so that the entirety formed by the second upper part 42 and the second lower part 32 realizes better direct contact and connection with the integrated circuit board pin.

It should be noted that the situation of the present disclosure in which the orthographic projection of the upper part substantially coincides with the orthographic projection of the opening includes: a situation that the orthographic projection of the upper part completely coincides with the orthographic projection of the opening, and a situation that the orthographic projection of the upper part incompletely coincides with the orthographic projection of the opening, such as the case that the orthographic projection of the upper part is located within the orthographic projection of the opening. In the case that the orthographic projection of the upper part incompletely coincides with the orthographic projection of the opening, for example, the ratio of an area of a non-overlapping portion of the two to an overlapping area of the two is equal to or less than 10%.

FIG. 7B is a schematic cross-sectional view taken along line A-A' in FIG. 6A, and FIG. 7B takes the first protection parts of two detection lead wires spaced apart from each other as an example. For example, as shown in FIGS. 6A and 7B, the protection part C10 includes a first protection part C10A. The first lower part 31 includes a first sub-lower part 311, the first opening includes a first sub-opening V11, and the first sub-opening V11 exposes the first sub-lower part 311; the first upper part 41 includes a first sub-upper part 411, the first sub-upper part 411 is stacked with the first sub-lower part 311 in a direction perpendicular to the substrate 1 and located on a side of the first sub-lower part 311 away from the substrate 1, at least a part of the first sub-upper part 411 is located in the first sub-opening V11 and is in direct contact with the first sub-lower part 311. The first protection part C10A includes the first sub-lower part 311 and the second sub-upper part 411, the detection lead wire C1 has an end in direct contact with the corresponding second pin C3, and the end has the first protection part C10A.

FIG. 7C is a schematic cross-sectional view along line B-B' in FIG. 6A, and FIG. 7C takes the second protection parts of two detection lead wires spaced apart from each other as an example. For example, as shown in FIGS. 6A and 7C, the protection part C10 further includes a second protection part C10B. The first lower part 31 includes a second sub-lower part 312, the first opening includes a second sub-opening V12, and the second sub-opening V12 exposes the second sub-lower part 312; the first upper part 41 includes a second sub-upper part 412, the second sub-upper part 412 is stacked with the second sub-lower part 312 in a direction perpendicular to the substrate 1 and located on a side of the second sub-lower part 312 away from the substrate 1, at least a part of the second sub-upper part 412 is located in the second sub-opening V12 and is in direct contact with the second sub-lower part 312. The second protection part C10B includes the second sub-lower part 312 and the second sub-upper part 412. The plurality of detection lead wires C1 are located on at least one side of the integrated circuit board IC in the first direction D1. For example, the plurality of detection lead wires C1 are located on both sides of the integrated circuit board IC in the first direction D1. FIG. 5A only shows the structure on the left side of the extension part in FIG. 1, for example, a structure symmetrical with the structure shown in FIG. 5A is provided on the right side of the extension part. The detection lead wire C1 includes a first detection lead wire close to the integrated circuit board IC in the first direction D1; for example, the detection lead wires in the triangle-shaped dotted line frame in FIG. 6A are the first detection lead wires. The first detection lead wire has a second protection part C10B. For one first detection lead wire, the second protection part C10B of the first detection lead wire is connected to the first protection part C10A of the same first detection lead wire and located on a side of the first protection part C10A of the first detection lead wire away from the second pin C3. That is, the second protection part C10B is electrically connected to the corresponding second pin C3 through the first protection part C10A.

Figure 5B:
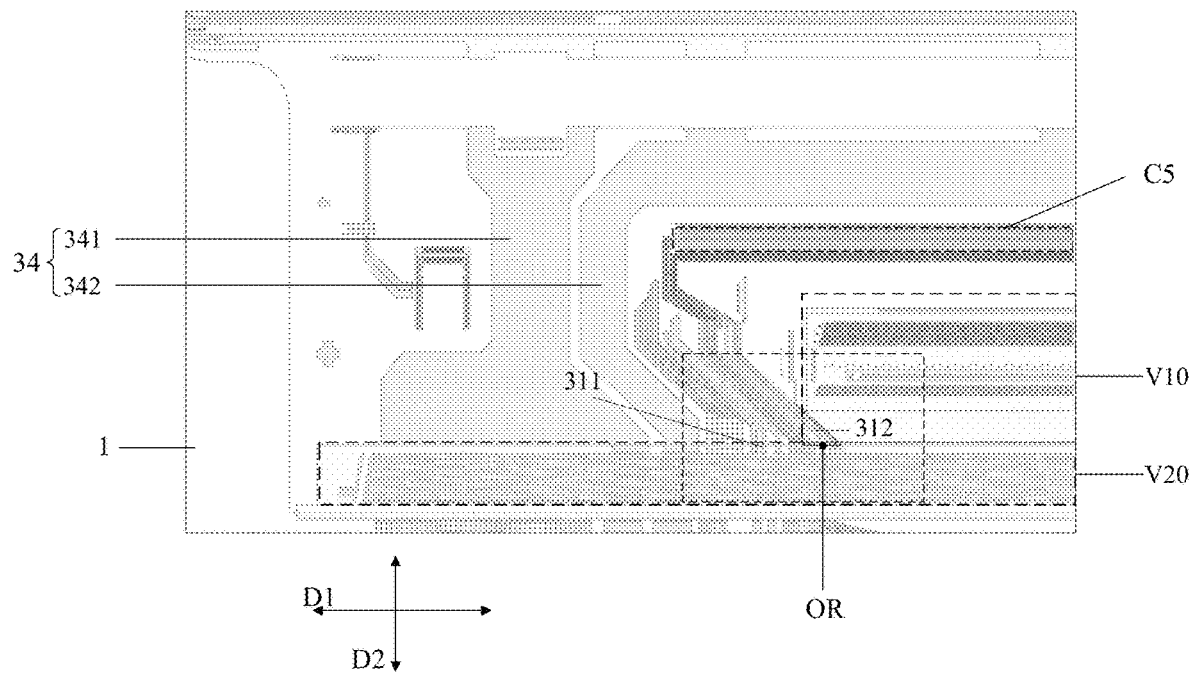
FIG. 5B is a schematic structural diagram of the display substrate after forming the first electrically conductive layer in FIG. 5A and performing a second patterning process on a first insulation material layer to form an opening region during the manufacturing process of the display substrate.

For example, the second direction D2 is located as the same plane as the first direction D1 and intersects with (e.g., perpendicular to) the first direction D1. With reference to FIG. 5B and FIG. 6A, the first detection lead wire has an overlapping portion OR that overlaps with, that is, opposite to, the first pin C2 of the integrated circuit board IC in the second direction D2, and the overlapping portion OR is the portion in the triangle-shaped dotted line frame of FIG. 6A, thereby reducing the distance between the detection lead wire C1 and the IC in the first direction D1 to save space. For one first detection lead wire, the overlapping portion OR of the one first detection lead wire includes the second sub-lower part 312 and the second sub-upper part 412.

For example, for the first detection lead wire, the overlapping portion OR is located on a side of the end (i.e., the first protection part C10A) away from the second pin C3, and the overlapping portion OR is connected to the corresponding second pin C3 through the end.

For example, with reference to FIGS. 5A and 6A, the first detection lead wire includes an inclined portion intersecting with the first direction D1, and the inclined portion includes the overlapping portion OR. For example, at least part of the first detection lead wires are arranged in this way so as to reduce the distance between the detection lead wires C1 and the IC in the first direction D1.

For example, the third upper part 43 of each of the plurality of second pins C3 is integrally with the first upper part 41 of the corresponding detection lead wire C1 (e.g., the first detection lead wire), so that the third upper part 43 and the first upper part 41 can be integrally formed, which simplifies the structure and manufacturing process of the display substrate.

For example, as shown in FIG. 5A, the first pin C2 includes an input pin C21 and an output pin C22, and both the input pin C21 and the output pin C22 include the second upper part 42 and the second lower part 32; with reference to FIG. 6A, the second upper parts 32 of at least part of the input pins C21 are electrically connected to the third upper parts 43 of at least part of the second pins C3, so that the flexible circuit board FPC can be electrically connected to the input pin C21 of the integrated circuit board IC to provide the detection signal to the detection lead wire C1.

For example, with reference to FIG. 5A and FIG. 6A, the flexible circuit board FPC is located on a side of the detection lead wire C1 and the integrated circuit board IC that is close to an edge, away from the non-display region 12, of the extension part in the second direction D2; the plurality of input pins C21, the plurality of output pins C22 and the plurality of second pins C3 are arranged along in the second direction D2 and spaced apart from each other, and the plurality of input pins C21 are located between the plurality of output pins C22 and the plurality of second pins C3.

For example, FIG. 6C is a schematic planar view of the second electrically conductive layer in FIG. 6A. With reference to FIGS. 5A, 6A and 6C, the display substrate 10 further includes a plurality of connection electrodes 6. The plurality of connection electrodes 6 are disposed in the same layer as the second upper part 42 and the third upper part 43, for example, all of them are located in the second electrically conductive layer. The plurality of connection electrodes 6 extend across the gap between the plurality of input pins C21 and the plurality of second pins C3 to electrically connect the second upper parts 42 of the plurality of input pins C21 with the third upper parts 43 of the plurality of second pins C3 in one-to-one correspondence.

For example, in some embodiments, as shown in FIG. 7B and FIG. 7C, an orthographic projection of the first upper part 41 on the substrate 1 substantially coincides with an orthographic projection of the first opening on the substrate 1, that is, for one first detection lead wire, an orthographic projection of the first sub-upper part 411 of the one first detection lead wire on the substrate 1 substantially coincides with the orthographic projection of the corresponding first sub-opening V11 on the substrate 1, and an orthographic projection of the second sub-upper part 412 of one first detection lead wire on the substrate 1 substantially coincides with an orthographic projection of the corresponding second sub-opening V12 on the substrate 1.

Figure 7F:
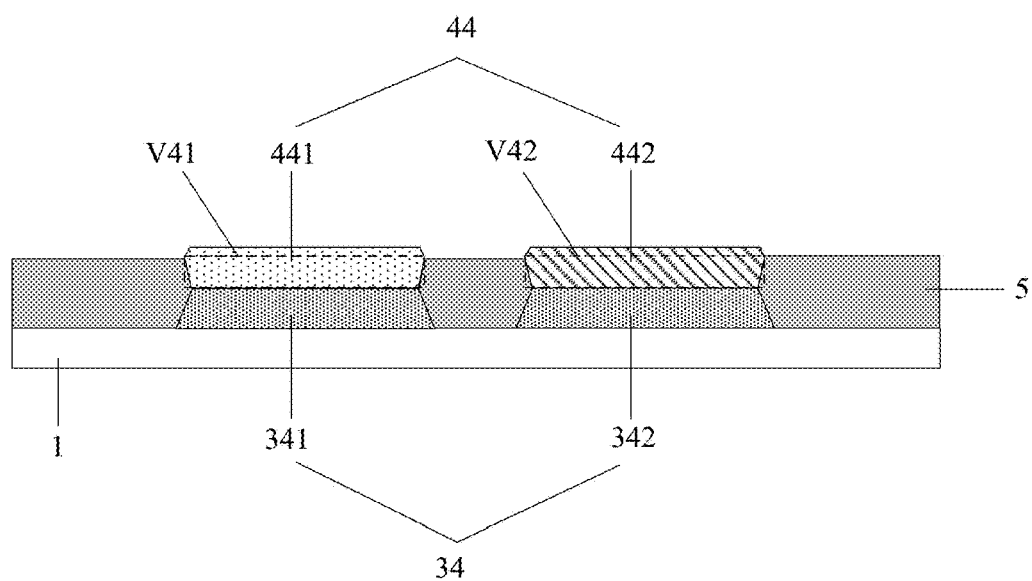
FIG. 7F is a schematic cross-sectional view taken along line E-E' in FIG. 5A.
Figure 7G:
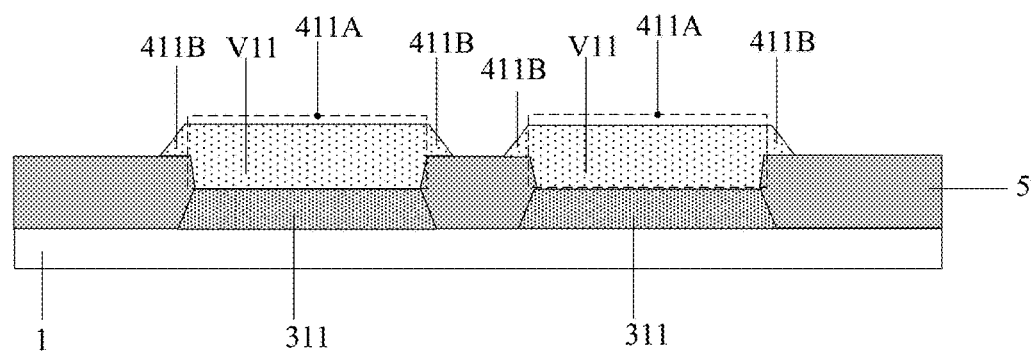
FIG. 7G is another schematic cross-sectional view taken along the line A-A' in FIG. 6A.

FIG. 7G is another schematic cross-sectional view taken along the line A-A' in FIG. 6A. For another example, in other embodiments, as shown in FIG. 7G, for one first detection lead wire, the first upper part 41 includes an inner part and an outer part. For example, taking the first protection part C10A of the first detection lead wire as an example, the first sub-upper part 411 of the first protection part C10A includes an inner part 411A and an outer part 411B. The inner part 411A is located inside the first sub-opening V11 and is in direct contact with the first sub-lower part 311; the outer part 411B is located outside the first sub-opening V11, the first insulation layer 5 is located between the outer part 411B and the first sub-lower part 311, and a lower surface of the outer part 411B close to the substrate 1 is in direct contact with the first insulation layer 5, that is, there is no other layer between the first insulation layer 5 and the outer part 411B. Here, the first sub-opening V11 is taken as an example of the first opening, the first sub-lower part 311 is taken as an example of the first lower part, and the first sub-upper part 411 is taken as an example of the first upper part.

Figure 7H:
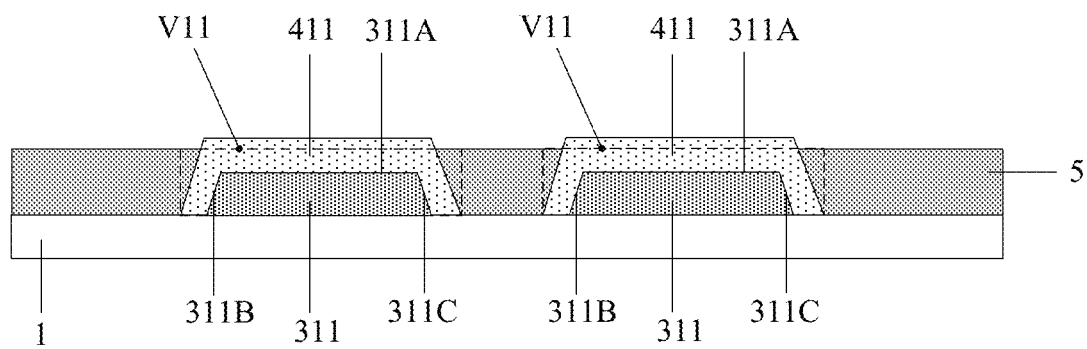
FIG. 7H is another schematic cross-sectional view taken along the line A-A' in FIG. 6A.

FIG. 7H is another schematic cross-sectional view taken along the line A-A' in FIG. 6A. For another example, in other embodiments, as shown in FIG. 7H, for one first detection lead wire, the first sub-upper part 411 of the one first detection lead wire covers the first sub-lower part 311 of the one first detection lead wire, and the first sub-upper part 411 and the first sub-lower part 311 of the one first detection lead wire are located inside the first sub-opening V11. Here, the first sub-opening V11 is taken as an example of the first opening, the first sub-lower part 311 is taken as an example of the first lower part, and the first sub-upper part 411 is taken as an example of the first upper part.

For example, with reference to FIG. 1 and FIG. 5A, the pixel circuit includes a power line C4, at least part of the power line C4 includes a portion that is located in the extension part 13, the power line C4 is configured to provide a power voltage to the pixel circuit and is electrically connected to a part of the plurality of second pins C3 of the flexible circuit board FPC. The flexible circuit board FPC is configured to provide the power voltage to the pixel circuit. The power lines are located, for example symmetrically arranged, on both sides, of the IC in the first direction. The aforementioned electrically conductive structure C includes the portion of the power line C4 located in the extension part 13, and the portion of the power line C4 located in the extension part 13 is another example of the electrically conductive structure C.

It should be noted that, not only the first detection lead wire may have the structure shown in FIG. 7G or FIG. 7H, for other wires having the electrically conductive structure C and other examples of the electrically conductive structure C, such as the first pin C2, the second pin C3, the power line C4, an electrostatic shielding (ESD) unit C5, etc., may all have the structure shown in FIG. 7G or FIG. 7H.

FIG. 7F is a schematic cross-sectional view taken along the line E-E' in FIG. 5A. With reference to FIG. 7F, the lower part of the electrically conductive structure includes a fourth lower part 34, the opening of the electrically conductive structure includes a fourth opening, the fourth lower part 34 is located on a side of the first insulation layer 5 close to the substrate 1, and the fourth opening exposes the fourth lower part 34; the upper part of the electrically conductive structure includes a fourth upper part 44, the fourth upper part 44 is stacked with the fourth lower part 34 in a direction perpendicular to the substrate 1 and located on a side of the fourth lower part 34 away from the substrate 1, at least a part of the fourth upper part 44 is located in the fourth opening, a lower surface of the fourth upper part 44 close to the substrate 1 is in direct contact with the fourth lower part 34, and an orthographic projection of the fourth upper part 44 on the substrate 1 substantially coincides with an orthographic projection of the fourth opening on the substrate 1; a portion of the power line C4 located at the extension 13 includes the fourth upper part 44 and the fourth lower part 43, so as to increase the thickness of the power line in a direction perpendicular to the substrate 1 and reduce the resistance of the power line. That is, the power line C4 includes a third protection part (i.e., the portion corresponding to the E-E' line), and the third protection part is located at an end of the power line C4 that is connected to the second pins C3 of the flexible circuit board FPC.

For example, the power line C4 includes a first power line C4A and a second power line C4B. The first power line C4A is configured to provide a first power voltage to the display pixel; the second power line C4B is configured to provide a second power voltage to the display pixel, and the second power voltage has an opposite polarity to the first power voltage; for example, the first power voltage is a low-level voltage VSS, and the second power voltage is a high-level voltage VDD. The first power line C4A and the second power line C4B each includes a first portion located in the extension part 13, and at least one selected from the group consisting of the first portion of the first power line C4A and the first portion of the second power line C4B includes the fourth lower part and the fourth upper part; for example, as shown in FIG. 7F, the first power line C4A includes a fourth sub-lower part 341, the opening of the electrically conductive structure includes a fourth sub-opening V41, the fourth sub-lower part 341 is located on a side of the first insulation layer 5 close to the substrate 1 and the fourth sub-opening V41 exposes the fourth sub-lower part 341. The second power line C4B includes a fourth sub-lower part 342, the opening of the electrically conductive structure includes a fourth sub-opening V42, the fourth sub-lower part 342 is located on the side of the first insulation layer 5 close to the substrate 1, and the fourth sub-opening V42 exposes the fourth sub-lower part 342, so that the thicknesses of the first power line C4A and the second power line C4B are increased and thus the resistances of the first power line C4A and the second power line C4B are reduced.

For example, the second power line C4B further includes a second portion located in the display pixel of the display region 11, the second portion of the second power line C4B may be disposed in the same layer as the upper part, and both the second portion of the second power line C4B and the upper part are located in the second electrically conductive layer.

For example, as shown in FIG. 5A, the display substrate 10 further includes an electrostatic shielding (ESD) unit C5, which is located in the extension part 13 and is configured to shield the electrostatic interference of the detection lead wire. The aforementioned electrically conductive structure C includes the electrostatic shielding unit C5, which is yet another example of the electrically conductive structure. The lower part of the electrically conductive structure includes a fifth lower part, the opening of the electrically conductive structure includes a fifth opening, the fifth lower part is located on the side of the first insulation layer 5 close to the substrate 1, and the fifth opening exposes the fifth lower part; the upper part of the electrically conductive structure includes a fifth upper part, the fifth upper part is stacked with the fifth lower part in a direction perpendicular to the substrate 1 and is located on a side of the fifth lower part away from the substrate 1, at least a part of the fifth upper part is located in the fifth opening, a lower surface of the fifth upper part close to the substrate 1 is in direct contact with the fifth lower part, and an orthographic projection of the fifth upper part on the substrate 1 substantially coincides with an orthographic projection of the fifth opening on the substrate 1; and the electrostatic shielding unit includes the fifth lower part and the fifth lower part, which increases the thickness of the ESD line of the electrostatic shielding unit and reduces the resistance of the ESD line.

For example, as shown in FIGS. 5A and 5B, in the second direction D2, the electrostatic shielding (ESD) unit C5 is located on the side of the plurality of first pins C2 away from the second pins C3, that is, on the side of the integrated circuit board IC away from the second pins C3. For example, the electrostatic shielding unit C5 includes a plurality of electrostatic shielding lines (ESD lines), for example, at least part of the plurality of ESD lines extend along the first direction D1, and the plurality of ESD lines are arranged along the second direction D2. For example, the plurality of ESD lines extend beyond the plurality of first pins C2 in the first direction D1, that is, the length of the plurality of ESD lines in the first direction D1 is greater than the length of the integrated circuit board IC in the first direction D1.

Figure 10:
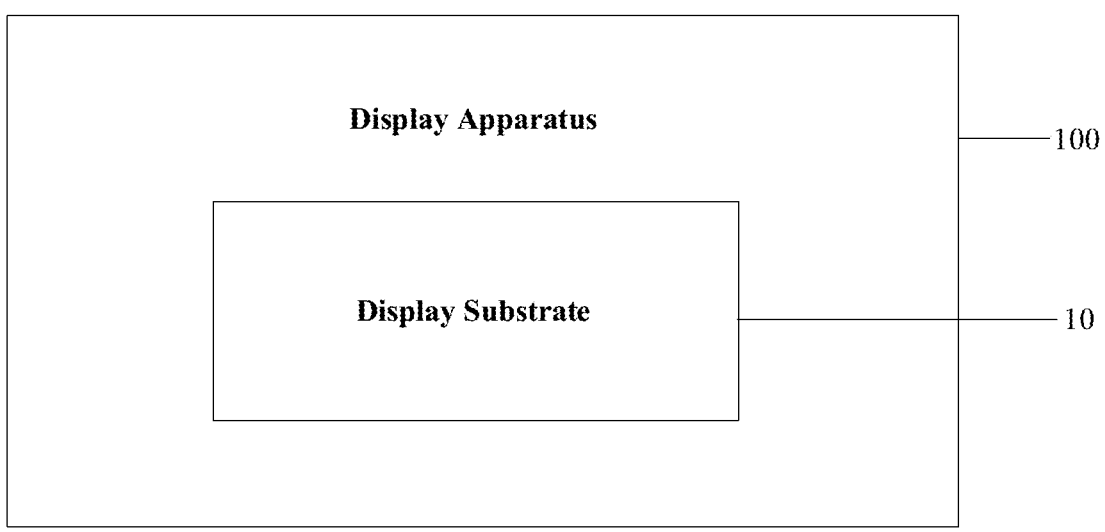
FIG. 10 is a schematic diagram of a display apparatus provided by an embodiment of the present disclosure.

As shown in FIG. 10, at least one embodiment of the present disclosure further provides a display apparatus 100, and the display apparatus includes any one of the display substrates 10 provided in the embodiments of the present disclosure.

The display apparatus may be, for example, a display panel, or any product or component with a display function, such as a display, an OLED panel, an OLED TV, electronic paper, a mobile phone, a tablet computer, a laptop computer, a digital photo frame, a navigator and the like.

At least one embodiment of the present disclosure further provides a method for manufacturing a display substrate 10, the display substrate 10 includes a display region 11, a non-display region 12 and an extension part 13. The display region 11 includes a display pixel, and the non-display region 12 at least partially surrounds the display region 12.

The manufacturing method includes steps 1-3, and the steps 1-3 are not limited to the order from step 1 to step 3.

Step 1: providing a substrate 1, the substrate 1 is located in the display region 11, the non-display region 12 and the extension part 13, and includes a bendable part 12A located at an edge of the non-display region 12 away from the display region 11; the display substrate 10 has a first side for display (i.e., a display side) and a second side opposite to the first side (i.e., a non-display side), the extension part 13 is connected to the bendable part 12A and is able to be bent to the second side of the display substrate 10 through the bendable part 12A. For example, the substrate 1 is rigid, such as a glass substrate, a quartz substrate, etc., or the substrate 1 is flexible, such as a polyimide (PI) substrate, etc. The extension part 13 is made from a flexible material, such as polyimide (PI), rubber and other materials.

Step 2: forming a first insulation layer 5 on at least the extension part 13 and forming an opening in the first insulation layer 5. For example, a portion of the first insulation layer 5 is located in the extension part 13, and another portion of the first insulation layer 5 is located in the display region 11 and the non-display region 12 at the display side.

Step 3: forming an electrically conductive structure on the extension part 13, the step of forming the electrically conductive structure includes: forming a lower part, in which the lower part is located on a side of the first insulation layer 5 close to the substrate 1, and the opening exposes the lower part; and forming an upper part, in which the upper part is stacked with the lower part in a direction perpendicular to the substrate 1 and located on a side of the lower part away from the substrate 1, at least a part of the upper part is located in the opening and in direct contact with the lower part.

For example, FIGS. 8A-8H are schematic diagrams of a manufacturing method of an electrically conductive structure provided by an embodiment of the present disclosure. This embodiment takes a manufacturing method of the second lower part 32 and the second upper part 42 of the first wire C2 as an example. The formation of the electrically conductive structure in the step 3 includes steps 31A-38A.

Figure 8A:
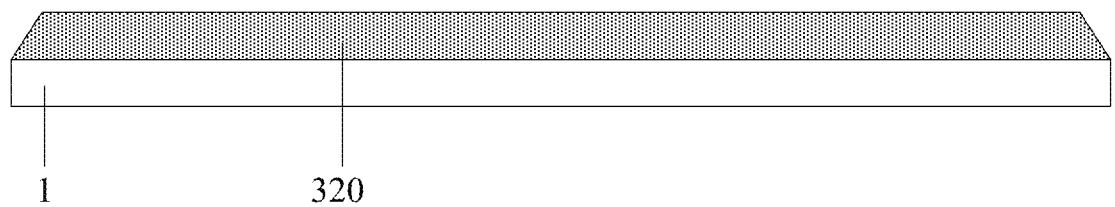
FIGS. 8A-8H are schematic diagrams of a manufacturing method of an electrically conductive structure provided by an embodiment of the present disclosure.

Step 31A: as shown in FIG. 8A, forming a first electrically conductive material layer 320.

Figure 8B:
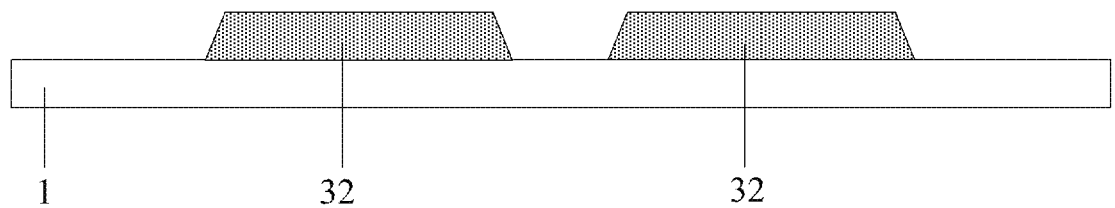

Step 32A: as shown in FIG. 8B, performing a first patterning process on the first electrically conductive material layer 320 to form a first electrically conductive layer, the first electrically conductive layer includes the lower part of the electrically conductive structure, and the lower part includes a second lower part 32.

Figure 8C:
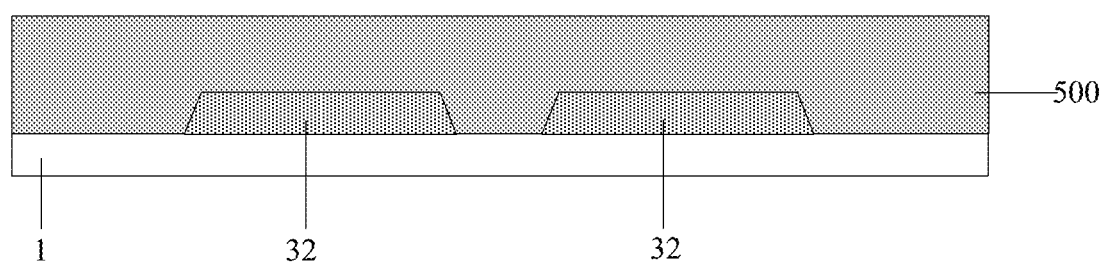

Step 33A: as shown in FIG. 8C, forming a first insulation material layer 500 that covers the lower part, such as the second lower part 32, wherein the first insulation material layer 500 is in direct contact with the lower part, such as the second lower part 32.

Figure 8D:
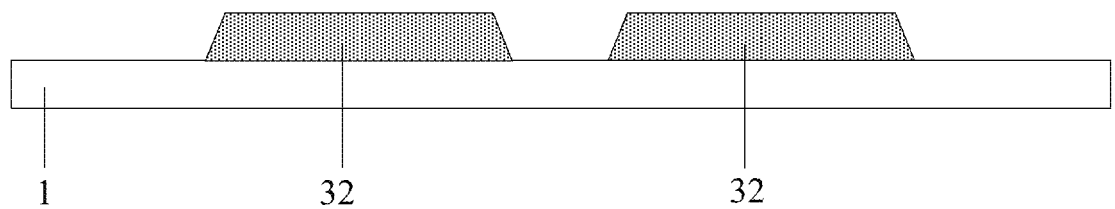

Step 34A: as shown in FIG. 8D, performing a second patterning process on the first insulation material layer to form an intermediate insulation layer, in which the intermediate insulation layer includes an opening region, and the opening region exposes at least part of the lower part such as the second lower part 32. FIG. 5B is a schematic structural diagram of the display substrate after forming the first electrically conductive layer in FIG. 5A and performing a second patterning process on the first insulation material layer 500 to form an opening region during the manufacturing process of the display substrate; FIG. 6B is a schematic structural diagram of the display substrate after forming the first electrically conductive layer in FIG. 6A and performing a second patterning process on the first insulation material layer 500 to form an opening region during the manufacturing process of the display substrate. With reference to FIGS. 5B and 6B, the opening region formed in step 34 includes a first opening region V10 and a second opening region V20 shown in FIG. 5B. Because the first opening region V10 (represented by the dotted line frame in FIG. 5B and FIG. 5C) exposes the entire region for arranging the integrated circuit board IC, that is, exposes the entire region where the plurality of first pins C2 spaced apart from each other are located, there is no intermediate insulation layer between the second lower parts 32 of the adjacent first pins C2 as shown in FIG. 7D, and thus the intermediate insulation layer is not shown in FIG. 8E; the intermediate insulation layer is an insulation layer including the first opening region V10 and the second opening region V20 in FIG. 5B.

Figure 8E:
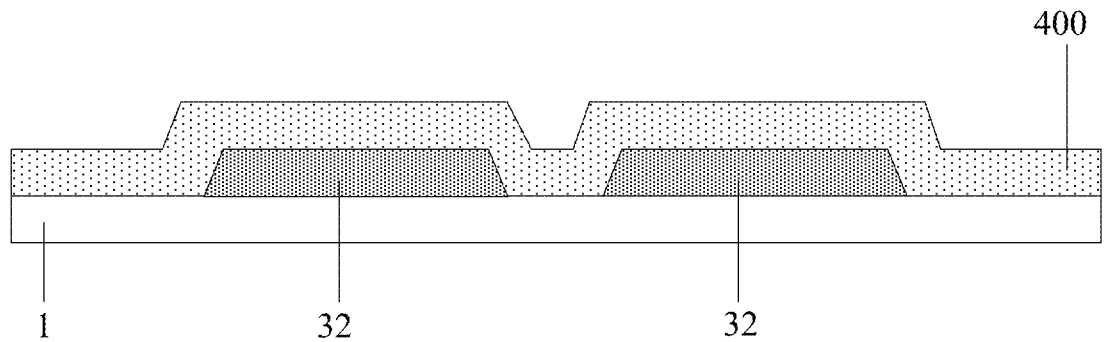

Step 35A: as shown in FIG. 8E, forming a second metal material layer 400 on a side of the intermediate insulation layer away from the substrate 1, in which the second metal material layer 400 includes a first portion located in the opening region and a second portion located outside the opening region. The first portion is in direct contact with the lower part, and a lower surface of the second portion close to the substrate 1 is in direct contact with an upper surface of the first insulation material layer away from the substrate 1, so that there is no other layer between the second electrically conductive layer, which is subsequently formed by performing a patterning process on the second metal material layer, and the first electrically conductive layer; in this way, the structure is simplified in the case that the first lower part is thickened to reduce the resistance of the first pin C2.

Figure 8F:
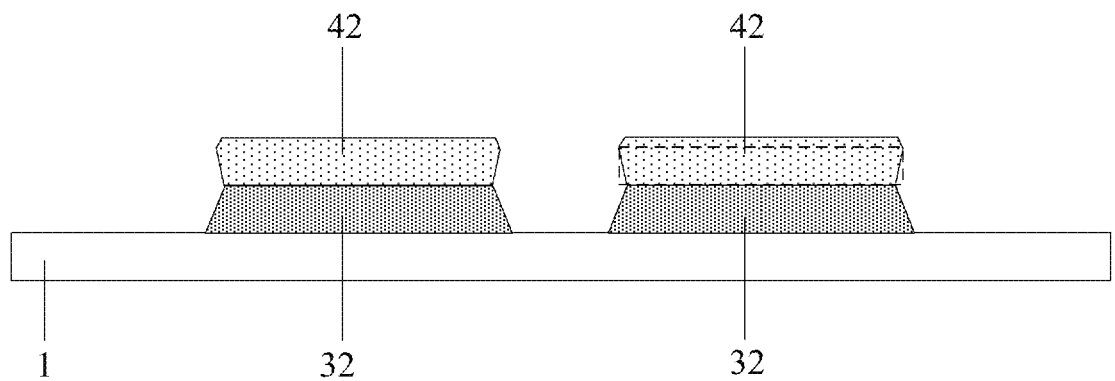

Step 36A: as shown in FIG. 8F, performing a third patterning process on the second metal material layer 400 to form the upper part of the electrically conductive structure, such as the second upper part 42.

Figure 8G:
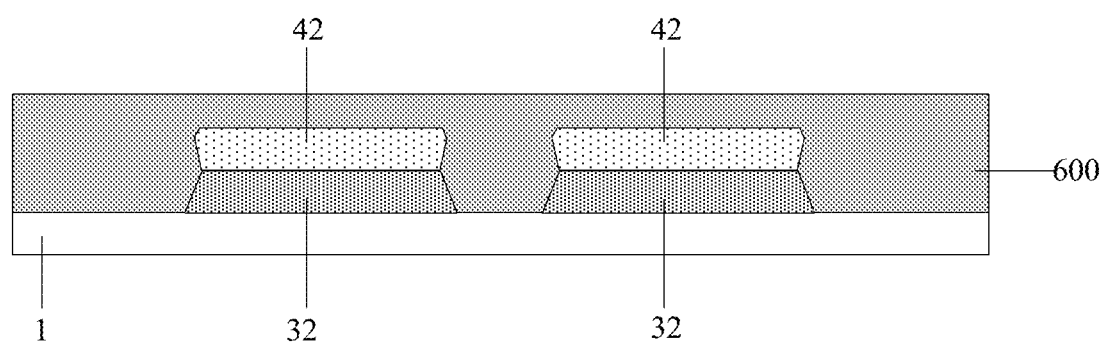

Step 37A: as shown in FIG. 8G, forming a second insulation material layer 600 that covers the upper part and the opening region (here, the opening region includes the space between two adjacent second lower parts 32), wherein the second insulation material layer 600 is in direct contact with the lower part, such as the second lower parts 32, that is, there is no other layer between the lower part and the insulation layer finally formed of the second insulation material layer 600.

Figure 8H:
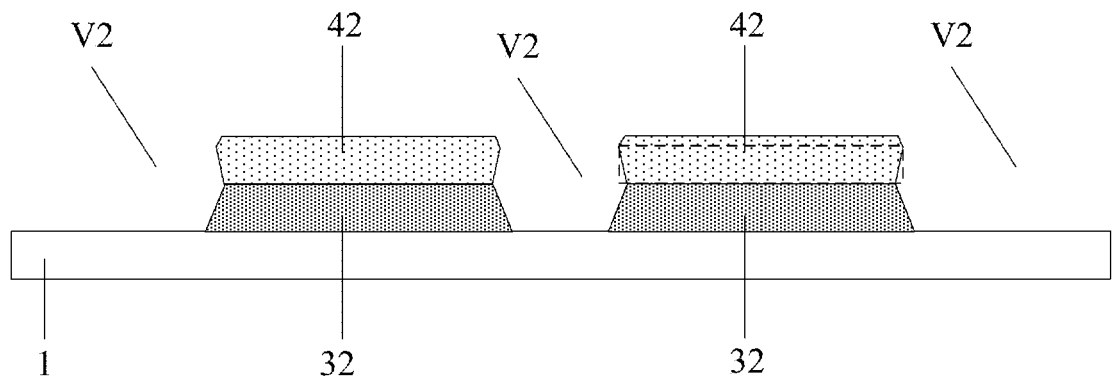

Step 38A: as shown in FIG. 8H, performing a fourth patterning process on the second insulation material layer 600 to form the opening of the electrically conductive structure C, for example an opening V2 exposing the second upper part 42, and to form the first insulation layer 5. Because the first opening region V10 exposes the entire region for arranging the integrated circuit board IC, that is, exposes the entire region where the plurality of first pins C2 spaced apart from each other are located, there is no intermediate insulation layer between the second lower parts 32 of the adjacent first pins as shown in FIG. 7D, and thus the first insulation layer 5 is not shown in FIG. 8H.

For example, the manufacturing method of the display substrate 10 further includes steps 4-8, and the steps 4-8 do not represent any order.

Step 4: forming a pixel circuit, wherein the pixel circuit is configured to control a display state of the display pixel;

Step 5: forming a driving circuit, wherein the driving circuit is located at least partially in the non-display region 12 and includes a driving signal line at least partially located in the non-display region 12, the driving signal line is configured such that a driving signal is provided to the pixel circuit; the specific types of the driving signal line may refer to the description in the previous embodiments;

Step 6: forming a detection lead wire C1, in which the detection lead wire C1 is electrically connected to the driving signal line and configured to provide the detection signal to the driving signal line, and extends from the non-display region 12 of the display substrate 10 to the extension part 13 of the display substrate 10 by passing through the bendable part; the detection lead wire C1 includes a protection part C10, which is an example of the aforementioned electrically conductive structure C. A lower part of the protection part C10 includes a first lower part 31, the opening of the electrically conductive structure includes a first opening, the first lower part 31 is located on a side of the first insulation layer 5 close to the substrate 1, and the first opening exposes the first lower part 31; the upper part includes a first upper part 41, the first upper part 41 is stacked with the first lower part 31 in a direction perpendicular to the substrate 1 and located on a side of the first lower part 31 away from the substrate 1, at least a part of the first upper part 41 is located in the first opening and is in direct contact with the first lower part 31; and the protection part C10 includes the first lower part 31 and the first upper part 41;

Step 7: providing an integrated circuit board IC on the extension part 13, in which the integrated circuit board IC is located in the extension part 13 and configured to provide a driving signal to the driving circuit, the extension part 13 has an edge μl extending along the first direction D1; and Step 8: forming a first pin C2 on the extension part 13, in which the electrically conductive structure includes the first pin C2, the lower part includes a second lower part 32, the opening includes a second opening, the second lower part 32 is located on a side of the first insulation layer 5 close to the substrate 1, and the second opening exposes the second lower part 32; the upper part includes a second upper part 42, the second upper part 42 is stacked with the second lower part 32 in a direction perpendicular to the substrate 1 and located on a side of the second lower part 32 away from the substrate 1, the second upper part 42 is at least partially located in the second opening, a lower surface of the second upper part 42 close to the substrate 1 is in direct contact with the second lower part 32, and an orthographic projection of the second upper part 42 on the substrate 1 substantially coincides with an orthographic projection of the second opening on the substrate 1; the first pin C2 includes the second lower part 32 and the second upper part 42; the first opening region V10 exposes the second lower parts 32 of the plurality of first pins C2 and the first lower parts 31 of at least part of the detection lead wires C1.

For example, the manufacturing method of the display substrate 10 further includes steps 9-10, and the steps 9-10 do not represent any limitation to the step order.

Step 9: providing a flexible circuit board FPC on the extension part 13, in which the flexible circuit board FPC is connected with the detection lead wire C1 and configured to provide a detection signal to the detection lead wire C1, and the flexible circuit board FPC is connected to the integrated circuit board IC and configured to provide the integrated circuit board with an electrical signal for generating the driving signal; and Step 10: forming second pins C3 on the extension part 13, in which the second pins C3 are connected to the flexible circuit board FPC, the second pins C3 includes first part pins, and each first part pin is connected to the detection lead wire C1, the electrically conductive structure includes a second pin C3, which is another example of the electrically conductive structure C; the second pin C3 includes a third lower part 33, and the lower part includes a third lower part 33.

With reference to FIG. 5B, for example, the first opening region V10 and the second opening region V20 formed in the aforementioned intermediate insulation layer are connected to and communicated with each other, and the second opening region V20 exposes the third lower part 33.

For example, the protection part C10 includes a first protection part C10A, the first lower part 31 includes a first sub-lower part 311, the first opening includes a first sub-opening V11, the first sub-lower part 311 is located on a side of the first insulation layer 5 close to the substrate 1, and the first sub-opening V11 exposes the first sub-lower part 311; the first upper part 41 includes a first sub-upper part 411, and the first sub-upper part 411 and the first sub-lower part 311 are stacked in a direction perpendicular to the substrate 1 and located on a side of the first sub-lower part 311 away from the substrate 1, at least a part of the first sub-upper part 411 is located in the first sub-opening V11 and is in direct contact with the first sub-lower part 311; the first protection part C10A includes the first sub-lower part 311 and the first sub-upper part 411; the detection lead wire C1 has an end that is in direct contact with the second pin C3, and the end has a first protection part C10A. With reference to FIG. 5B, the first opening region V10 exposes the second lower parts 32 of the plurality of first wires C2 and the first sub-lower part 311 of the end.

For example, the protection part includes a second protection part C10B, the second lower part 32 includes a second sub-lower part 312, the first opening includes a second sub-opening V12, the second sub-lower part 312 is located on a side of the first insulation layer 5 close to the substrate 1 and the second sub-opening V12 exposes the second sub-lower part 312; the second upper part 42 includes a second sub-upper part 412, and the second sub-upper part 412 is stacked with the second sub-lower part 312 in a direction perpendicular to the substrate 1 and located on a side of the second sub-upper part 412 away from the substrate 1, the second sub-upper part 412 is at least partially located in the second sub-opening V12 and is in direct contact with the second sub-lower part 312; the second protection part C10B includes the second sub-lower part 312 and the second sub-upper part 412; in the first direction D1, the detection lead wire C1 is located on at least one side of the integrated circuit board IC; the plurality of detection lead wires C1 include a first detection lead wire C1 close to the integrated circuit board IC, the second direction D2 is located as the same plane as the first direction D1 and intersects with the first direction D1; the first detection lead wire C1 has an overlapping portion OR that overlaps with the first pin C2 in the second direction D2, and the overlapping portion OR has the second sub-lower part 312 and the second sub-upper part 412. With reference to FIG. 5B, the first opening region V10 further exposes the second lower parts 32 of the plurality of first pins C2 and the second sub-lower part 312 of the overlapping portion OR.

For example, the first opening region V10 exposes the entire region used for arranging the integrated circuit board IC, that is, exposes the entire region where the plurality of first pins C2 are located; in the case that other insulation layers are subsequently formed on the first insulation layer 5, the entire region where the plurality of first pins C2 are located are still exposed, so as to ensure that the entire region for arranging the integrated circuit board IC can be exposed before bonding the IC; moreover, the first pin C2 is not limited to only include a two-layer stack structure formed of the first lower part 31 and the first upper part 41, for example, in the case that other insulation layers are formed above the first insulation layer 5 and therefore increasing the step difference between the integrated circuit board pin on the integrated circuit board IC and the first pin C2, a supplementary upper part that is stacked and in direct contact with the first upper part 41 is further formed on a side of the first upper part 41 away from the substrate 1, for example, an orthographic projection of the supplementary upper part on the substrate 1 substantially coincides with an orthographic projection of the first upper part 41 on the substrate 1. Likewise, the second pin C2 may be in the same manner.

For example, for the first detection lead wire C1, the overlapping portion OR is located on a side of the end away from the second pin C3, and the overlapping portion OR is connected to the second pin C3 through the end.

Figure 5C:
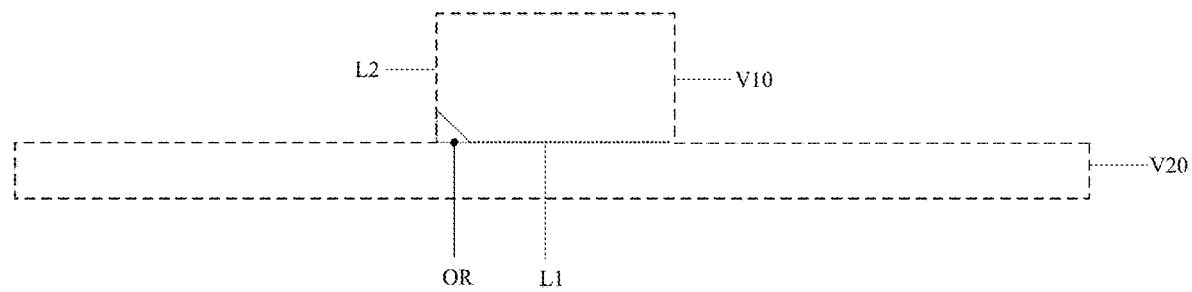
FIG. 5C is a schematic diagram of a first opening region and a second opening region of the opening region in FIG. 5B.
Figure 5D:
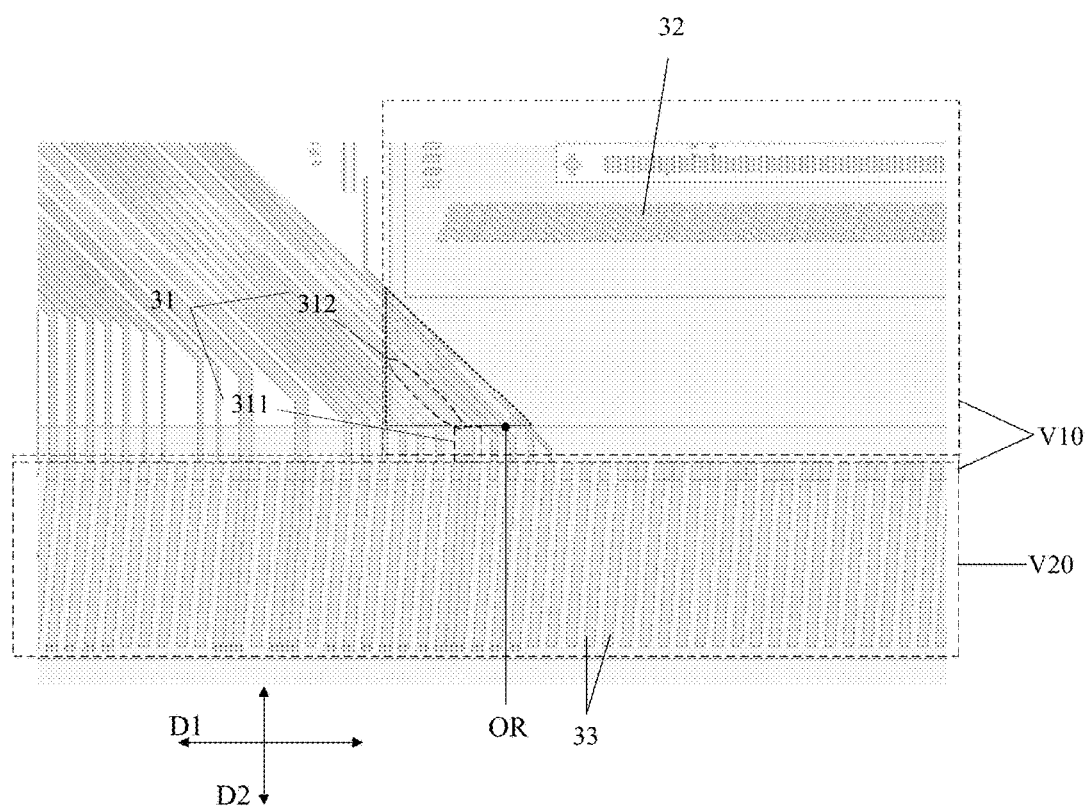
FIG. 5D is a schematic planar view of the second electrically conductive layer in FIG. 5A.

FIG. 5C is a schematic diagram of a first opening region and a second opening region of the opening region in FIG. 5B. For example, with reference to FIGS. 5B and 5C, the first opening region V10 includes a first edge L1 and a second edge L2. The first edge L1 extends along the first direction D1 as a whole and is a boundary between the first opening region V10 and the second opening region V20; the second edge L2 intersects with the first edge L1, for example, the second edge L2 extends along the second direction D2; the second edge L2 overlaps with the first lower part 31 in a direction perpendicular to the substrate 1, an included angle between the first edge L1 and the second edge L2 defines an included angle region (corresponding to the overlapping portion OR in the triangular-shaped dotted line frame in FIG. 5D), and the second sub-lower part 312 is located in the included angle region.

For example, as shown in FIG. 5C, a planar shape of the first opening region V10 is a first rectangle, a planar shape of the second opening region V20 is a second rectangle, and the length of the first rectangle along the first direction D1 is smaller than the length of the second rectangle along the first direction D1, an overall planar shape of the whole structure constituted by the first opening region V10 and the second opening region V20 is a T-shape. It should be noted that, FIG. 5A only shows the structure on the left side of the extension part in FIG. 1, for example, the right side of the extension part is provided with a structure symmetrical with the structure shown in FIG. 5A; and FIG. 5C shows the entire first opening region V10 and the entire second opening region V20.

For example, the integrated circuit board IC is provided with an integrated circuit board IC pin, and the flexible circuit board FPC is provided with a flexible circuit board pin. In the aforementioned step 7, providing the integrated circuit board IC on the extension part 13 includes: bonding the integrated circuit board IC with the substrate 1, so that the first pin C2 is in correspondence with the integrated circuit board IC pin, and an upper surface of the second upper part 42 of the first pin C2 away from the substrate 1 is in direct contact with the corresponding the integrated circuit board IC pin. In the aforementioned step 9, the step of providing the flexible circuit board FPC on the extension part 13 includes: bonding the flexible circuit board FPC to the substrate 1, so that a plurality of second pins C3 are in one-to-one correspondence with a plurality of flexible circuit board FPC pins, an upper surface of the third upper part, which is away from the substrate 1, of each of the plurality of second pins C3 is in direct contact with the corresponding flexible circuit board FPC pin.

For example, the manufacturing method of the display substrate 10 further includes: forming a pixel circuit, in which the pixel circuit further includes: a light emitting device, a driving transistor, a data writing transistor, a first gate line and a data line; the data writing transistor is configured to transmit a data signal, which is transmitted through the data line, to the driving transistor under the control of a first scan signal transmitted through the first gate line, the driving transistor is configured to control the magnitude of the driving current flowing through the driving transistor according to the data signal, and the light emitting device is configured to receive the driving current and be driven by the driving current to emit light. The manufacturing method of the display substrate 10 includes: forming the upper part and the data line by performing a third patterning process on the second electrically conductive material layer, that is, the upper part and the data line are formed by performing one same patterning process on one same layer.

For example, the pixel circuit further includes a first power line C4A and a second power line C4B. The first power line C4A is configured to provide a first power voltage to the display pixel; the second power line C4B is configured to provide a second power voltage to the display pixel, wherein the first power voltage is a low potential voltage and the second power voltage is a high potential voltage, Of course, the two may be also interchangeable. The second power line C4B includes a first portion located in the extension part 13 and a second portion located in the display pixel of the display region 11. For example, by performing the third patterning process on the second electrically conductive material layer, the second portion of the second power line C4B in the display pixel of the display region 11 is further formed. The specific features of the pixel circuit may refer to the descriptions in the previous embodiments of the display substrate, which will not be repeated; the specific features of several examples of the electrically conductive structure and the corresponding technical effects thereof may also refer to the previous descriptions of the display substrate embodiments, which will not be repeated. For example, the first opening region V10 in the aforementioned intermediate insulation layer further exposes the fourth lower parts 34 of the first power line C4A and of the second power line C4B shown in FIG. 7F.

For example, FIGS. 9A-9E are schematic diagrams of a manufacturing method of another conductive structure provided by an embodiment of the present disclosure. This embodiment takes the method for manufacturing the second sub-lower part 312 and the second sub-upper part 412 of the detection lead wire C1 as an example. The formation of the electrically conductive structure in the step 3 includes the aforementioned steps 31A-33A, and steps 31B-35B performed after the completion of the steps 31A-31C.

Figure 9A:
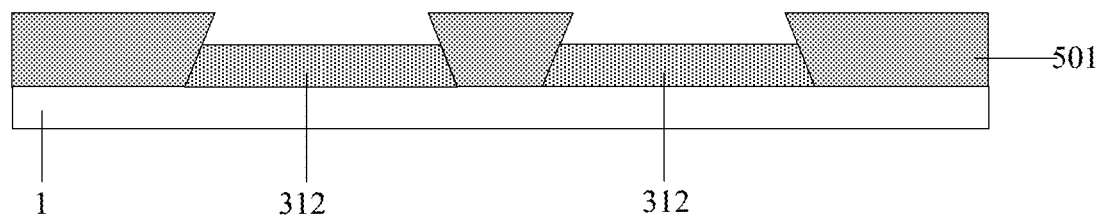
FIGS. 9A-9E are schematic diagrams of a manufacturing method of another conductive structure provided by an embodiment of the present disclosure.

Step 31B: as shown in FIG. 9A, performing a second patterning process on the first insulation material layer to form an intermediate insulation layer 501, wherein the intermediate insulation layer 501 includes an opening region that exposes at least part of the lower part, such as the second sub-lower part 312.

Figure 9B:
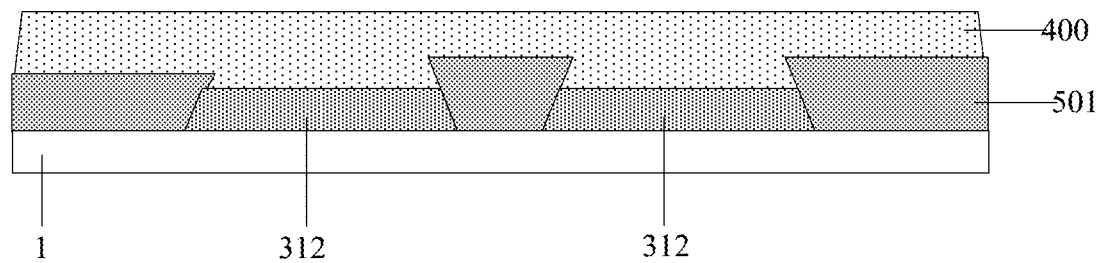

Step 32B: as shown in FIG. 9B, forming a second metal material layer 400 on a side of the intermediate insulation layer 501 away from the substrate 1, wherein the second metal material layer 400 includes a first portion located in the opening region and a second portion outside the opening region, the first portion is in direct contact with the lower part, and a lower surface of the second portion close to the substrate 1 is in direct contact with an upper surface of the first insulation material layer away from the substrate 1, so that there is no other layer between the second electrically conductive layer, which is subsequently formed by performing a patterning process on the second metal material layer, and the first electrically conductive layer; in this way, the structure is simplified in the case that the first lower part is thickened to reduce the resistance of the first pin C2.

Figure 9C:
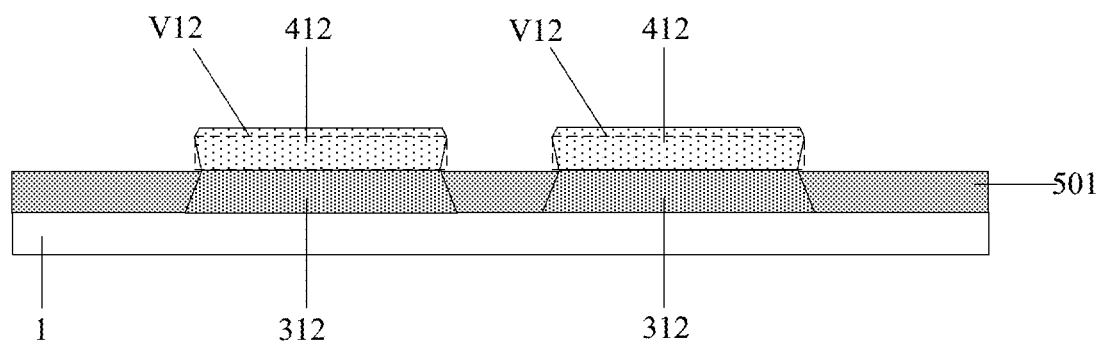

Step 33B: as shown in FIG. 9C, performing a third patterning process on the second metal material layer 400 to form the upper part of the electrically conductive structure, such as the second sub-upper part 412.

Figure 9D:
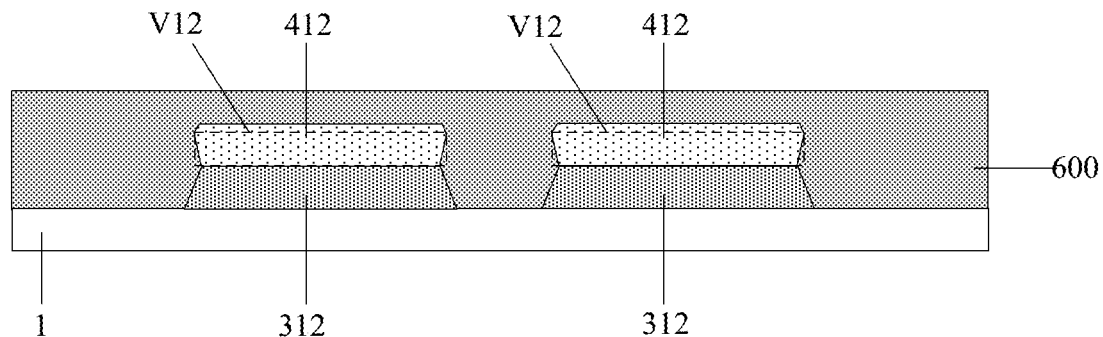
Figure 9E:
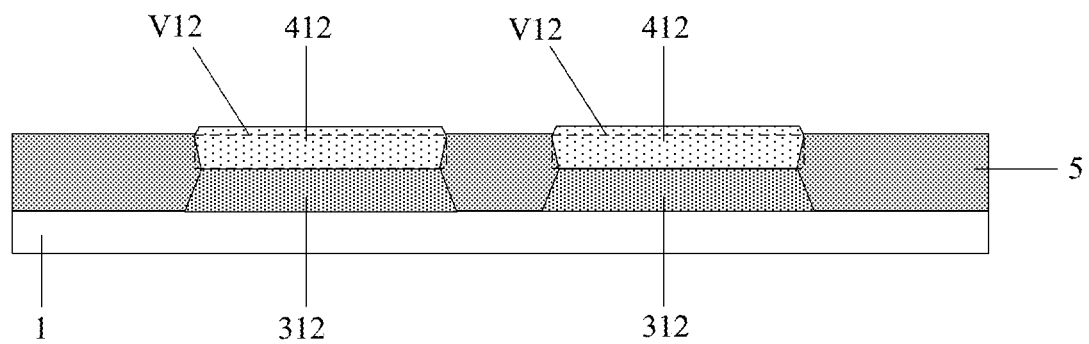

Step 34B: as shown in FIG. 9D, forming a second insulation material layer 600 that covers the upper part, for example the second sub-upper part 412, and the opening region (here, the opening region includes the gap between two adjacent second sub-lower parts 312), wherein the second insulation material layer 600 is in direct contact with the lower part, for example the second sub-lower part 312, that is, there is no other layer between the lower part and the insulation layer finally formed of the second insulation material layer 600. Step 35B: as shown in FIG. 9E, performing a fourth patterning process on the second insulation material layer 600 to form the opening of the electrically conductive structure C, for example the second opening V2 for exposing the second upper part 42, and to form the first insulation layer 5. In this embodiment, the first insulation layer 5 is composed of a remaining portion of the first insulation material layer after performing the patterning process on the first insulation material layer and a remaining portion of the second insulation material layer after performing the patterning process on the second insulation material layer. In some embodiments, on the basis of the structure shown in FIG. 9E, an electrically conductive part that is stacked and in direct contact with the second sub-upper part 412 may be further formed. That is, in the electrically conductive structure of the embodiments of the present disclosure, the number of similar stacked electrically conductive part including the upper and lower parts is not limited. Accordingly, after patterning the second insulation material layer, another insulation layer may be further formed on a side of the formed insulation layer away from the substrate 1, for example, a third insulation material layer is formed and a patterning process is performed on the third insulation material layer; the first insulation layer 5 of the final electrically conductive structure is composed of the remaining portion of each of the first insulation material layer, the second insulation material layer, and the third insulation material layer after being patterned, in order to ensure that both an upper surface of the first pin C2 away from the substrate and an upper surface of the second pin C3 away from the substrate are exposed, so that in the process of bonding the flexible circuit board FPC with the integrated circuit board IC, the upper surface of the first pin C2 away from the substrate and the upper surface of the second pin C3 away from the substrate are to be in direct contact with the flexible circuit board pin and the integrated circuit board pin, respectively.

What have been described above are only specific implementations of the present disclosure, the protection scope of the present disclosure is not limited thereto, and the protection scope of the present disclosure should be based on the protection scope of the claims.

The invention claimed is:

1. A display substrate, comprising a display region, a non-display region, and an extension part, wherein the display region comprises a display pixel, and the non-display region at least partially surrounds the display region; the display substrate comprises:
    a substrate which is in the display region, the non-display region and the extension part and comprises a bendable part at an edge of the non-display region away from the display region, wherein the display substrate has a first side and a second side opposite to the first side, the extension part is connected with the bendable part and is able to be bent to the second side of the display substrate through the bendable part;
    a first insulation layer, wherein at least a part of the first insulation layer is in the extension part and the first insulation layer comprises an opening; and
    an electrically conductive structure, on the extension part and comprising:
    a lower part, wherein the opening exposes at least part of the lower part;
    an upper part, on a side of the lower part away from the substrate, wherein at least a part of the upper part is in the opening and is in direct contact with the lower part; and
    the display substrate further comprises:
    a pixel circuit, in the display region and configured to control a display state of the display pixel;
    a driving circuit, wherein at least a part of the driving circuit is in the non-display region, the driving circuit comprises a driving signal line that is at least partially located in the non-display region, and the driving signal line is configured that a driving signal is provided to the pixel circuit;
    a detection lead wire, electrically connected to the driving signal line and configured to provide a detection signal to the driving signal line, wherein the detection lead wire extends from the non-display region of the display substrate to the extension part of the display substrate region by passing through the bendable part;
    an integrated circuit board, in the extension part and configured to provide the driving signal to the driving circuit;
    a first pin, wherein the electrically conductive structure comprises the first pin, the integrated circuit board is provided with an integrated circuit board pin, the integrated circuit board is bonded to a region where the first pin is located, and an upper surface of the first pin which is away from the substrate is in direct contact with the integrated circuit board pin;
    a flexible circuit board, in the extension part, wherein at least part of the flexible circuit board is connected to the detection lead wire and configured to provide the detection signal to the detection lead wire, and the flexible circuit board is connected to the integrated circuit board and configured to provide the integrated circuit board with an electrical signal for generating the driving signal; and the integrated circuit board is on a side of the flexible circuit board close to the bendable part;
    the lower part comprises a first lower part, the first lower part comprises a second sub-lower part, the opening comprises a first opening, the first opening comprises a second sub-opening, and the second sub-opening exposes at least part of the second sub-lower part;
    the upper part comprises a first upper part, the first upper part comprises a second sub-upper part, the second sub-upper part is stacked with the second sub-lower part in the direction perpendicular to the substrate and is on a side of the second sub-lower part away from the substrate, at least a part of the second sub-upper part is in the second sub-opening and is in direct contact with the second sub-lower part;
    the extension part has an edge opposite to the bendable part and extending along a first direction, a second direction is in the same plane as the first direction and intersects with the first direction, the detection lead wire is on at least one side of the integrated circuit board in the first direction, and the detection lead wire comprises a first detection lead wire closest to the integrated circuit board in the first direction, the first detection lead wire has an overlapping portion overlapping with the first pin in the second direction, the overlapping portion is between the flexible circuit board and the first pin in the second direction, and the overlapping portion comprises the second sub-lower part and the second sub-upper part; the first detection lead wire comprises an inclined portion intersecting with the first direction, and the inclined portion comprises the overlapping portion.

2. The display substrate according to claim 1, wherein the detection lead wire comprises a protection part, the electrically conductive structure comprises the protection part;
    the first opening exposes at least part of the first lower part;
    the first upper part is stacked with the first lower part in a direction perpendicular to the substrate and is on a side of the first lower part away from the substrate, the first upper part is at least partially in the first opening and is in direct contact with the first lower part; and
    the protection part comprises the first lower part and the first upper part.

3. The display substrate according to claim 2, wherein an orthographic projection of the first upper part on the substrate substantially coincides with an orthographic projection of the first opening on the substrate.

4. The display substrate according to claim 2, wherein the first upper part comprises:
    an inner part, in the first opening and in direct contact with the first lower part; and
    an outer part, outside the first opening, wherein the first insulation layer is between the outer part and the first lower part, and a lower surface of the outer part close to the substrate is in direct contact with the first insulation layer.

5. The display substrate according to claim 2, wherein the first upper part covers the first lower part, and the first upper part and the first lower part are in the first opening.

6. The display substrate according to claim 2, wherein
the lower part comprises a second lower part, the opening comprises a second opening, and the second opening exposes at least part of the second lower part; the upper part comprises a second upper part, the second upper part is stacked with the second lower part in the direction perpendicular to the substrate and is on a side of the second lower part away from the substrate, the second upper part is at least partially located in the second opening, a lower surface of the second upper part close to the substrate is in direct contact with the second lower part, and an orthographic projection of the second upper part on the substrate is within an orthographic projection of the second opening on the substrate; the first pin comprises the second lower part and the second upper part; and an upper surface of the second upper part of the first pin which is away from the substrate is in direct contact with the integrated circuit board pin.

7. The display substrate according to claim 6, further comprising:
a second pin, connected to the flexible circuit board and comprising a first part pin, wherein the first part pin is connected to the detection lead wire, wherein the lower part comprises a third lower part, the opening comprises a third opening, and the third opening exposes at least part of the third lower part;

the upper part comprises a third upper part, the third upper part is stacked with the third lower part in the direction perpendicular to the substrate and is on a side of the third lower part away from the substrate, at least a part of the third lower part is in the third opening, a lower surface of the third upper part close to the substrate is in direct contact with the third lower part, and an orthographic projection of the third upper part on the substrate substantially coincides with an orthographic projection of the third opening on the substrate;

the second pin comprises the third lower part and the third upper part;

the flexible circuit board is provided with a flexible circuit board pin, and an upper surface of the third upper part of the second pin which is away from the substrate is in direct contact with the flexible circuit board pin.

8. The display substrate according to claim 7, wherein the protection part comprises a first protection part, the first lower part comprises a first sub-lower part, the first opening comprises a first sub-opening, and the first sub-opening exposes at least part of the first sub-lower part;

the first upper part comprises a first sub-upper part, the first sub-upper part is stacked with the first sub-lower part in the direction perpendicular to the substrate and is on a side of the first sub-lower part away from the substrate, at least a part of the first sub-upper part is in the first sub-opening and is in direct contact with the first sub-lower part;

the first protection part comprises the first sub-lower part and the first sub-upper part, the detection lead wire has an end that is in direct contact with the corresponding second pin, and the end has the first protection part.

9. The display substrate according to claim 8, wherein the protection part comprises a second protection part, the second protection part comprises the second sub-lower part and the second sub-upper part;

the first detection lead wire has the first protection part and the second protection part, and the second protection part of the first detection lead wire is connected to the first protection part of the first detection lead wire and is on a side of the first protection part of the first detection lead wire away from the second pin.

10. The display substrate according to claim 9, wherein for the first detection lead wire, the overlapping portion is on a side of the end away from the second pin, and the overlapping portion is connected with the second pin through the end.

11. The display substrate according to claim 9, wherein the opening comprises a first opening region, the first opening region exposes the second lower part of a plurality of the first pins and the first lower part of at least part of the detection lead wire;

the opening region further comprises a second opening region, the first opening region is connected to and communicated with the second opening region, and the second opening region exposes the third lower part;

the first opening region comprises:

a first edge, extending along the first direction as a whole and is a boundary between the first opening region and the second opening region; and a second edge, intersecting with the first edge and overlapping with the first lower part in the direction perpendicular to the substrate, wherein an included angle between the first edge and the second edge defines an included angle region, and the second sub-lower part is located in the included angle region.

12. The display substrate according to claim 7, wherein the display substrate comprises a plurality of the second pins, and the plurality of second pins are arranged along the first direction; the display substrate comprises a plurality of the detection lead wires, and the first part pins of the plurality of second pins are connected to the plurality of detection lead wires in one-to-one correspondence;

the flexible circuit board is provided with a plurality of the flexible circuit board pins, the plurality of flexible circuit board pins are arranged along the first direction, and the plurality of second pins are connected with the plurality of flexible circuit board pins in one-to-one correspondence;

the third upper part of at least one of the plurality of second pins and the first upper part of a corresponding one of the plurality of detection lead wires are an integral structure.

13. The display substrate according to claim 12, wherein the first pin comprises an input pin and an output pin, both the input pin and the output pin comprise the second upper part and the second lower part;

the second upper part of the input pin is electrically connected to the third upper part of the second pin.

14. The display substrate according to claim 12, wherein the second direction is in a same plane as the first direction and intersects with the first direction, and the flexible circuit board is on a side of the detection lead wire and the integrated circuit board close to an edge of the extension part in the second direction; the display substrate comprises a plurality of the input pins and a plurality of the output pins;

in the second direction, the plurality of the input pins, the plurality of the output pins and the plurality of second pins are spaced apart from each other, and the plurality of input pins are between the plurality of the output pins and the plurality of second pins;

the display substrate further comprises:

a plurality of connection electrodes, arranged in a same layer as the second upper part and the third upper part, wherein the plurality of connection electrodes extend across a gap between the plurality of input pins and the plurality of second pins to electrically connect the second upper parts of the plurality of input pins with the third upper parts of the plurality of second pins in one-to-one correspondence.

15. The display substrate according to claim 7, wherein the pixel circuit comprises:
- a power line, comprising a portion in the extension part, configured to provide a power voltage to the pixel circuit, and electrically connected to a second part pin of a plurality of second pins of the flexible circuit board, the flexible circuit board is configured to provide the power voltage to the pixel circuit, wherein the electrically conductive structure comprises the portion of the power line in the extension part,
- the lower part comprises a fourth lower part, the opening comprises a fourth opening, and the fourth opening exposes at least part of the fourth lower part;
- the upper part comprises a fourth upper part, the fourth upper part is stacked with the fourth lower part in the direction perpendicular to the substrate and is on a side of the fourth lower part away from the substrate, at least a part of the fourth upper part is in the fourth opening, a lower surface of the fourth upper part close to the substrate is in direct contact with the fourth lower part, and an orthographic projection of the fourth upper part on the substrate substantially coincides with an orthographic projection of the fourth opening on the substrate; and
- the portion of the power line in the extension part comprises the fourth upper part and the fourth lower part;
- the power line comprises:
  - a first power line, configured to provide a first power voltage to the display pixel; and
  - a second power line, configured to provide a second power voltage to the display pixel, wherein the second power voltage and the first power voltage have opposite polarities;
- each of the first power line and the second power line comprises a first portion in the extension part, at least one of the first portion of the first power line and the first portion of the second power line comprises the fourth lower part and the fourth upper part;

the first power voltage provided by the first power line is a low potential voltage, and the second power voltage provided by the second power line is a high potential voltage;
the first power line further comprises a second portion located in the display pixel of the display region, and the second portion of the first power line is located in a same layer as the upper part.

16. The display substrate according to claim 2, wherein the display substrate further comprises:
- an electrostatic shielding (ESD) unit, in the extension part and configured to shield electrostatic interference of the detection lead wire, wherein the electrically conductive structure comprises the electrostatic shielding unit,
- the lower part comprises a fifth lower part, the opening comprises a fifth opening, and the fifth opening exposes at least part of the fifth lower part;
- the upper part comprises a fifth upper part, the fifth upper part is stacked with the fifth lower part in a direction perpendicular to the substrate and is on a side of the fifth lower part away from the substrate, at least a part of the fifth upper part is in the fifth opening, a lower surface of the fifth upper part close to the substrate is in direct contact with the fifth lower part, and an orthographic projection of the fifth upper part on the substrate substantially coincides with an orthographic projection of the fifth opening on the substrate; and
- the electrostatic shielding unit comprises the fifth lower part and the fifth upper part.

17. The display substrate according to claim 1, wherein the pixel circuit further comprises:
- a light emitting device, a driving transistor, a data writing transistor, a first gate line and a data line, wherein
- the data writing transistor is configured to transmit a data signal transmitted through the data line to the driving transistor under control of a first scan signal transmitted through the first gate line, and the driving transistor is configured to control an magnitude of the driving current flowing through the driving transistor according to the data signal, the light emitting device is configured to receive the driving current and be driven by the driving current to emit light;
- the data line is arranged in a same layer as the upper part.

18. A display apparatus, comprising the display substrate according to claim 1.

* * * * *